United States Patent
Kim et al.

(10) Patent No.: US 11,591,515 B2
(45) Date of Patent: Feb. 28, 2023

(54) SEMICONDUCTOR NANOCRYSTAL-LIGAND COMPOSITE AND ELECTRONIC DEVICE INCLUDING COMPOSITE

(71) Applicant: Samsung Electronics Co., Ltd., Suwon-si (KR)

(72) Inventors: Tae Ho Kim, Seongnam-si (KR); Chan Su Kim, Seoul (KR); Jaejun Chang, Gwacheon-si (KR); Eun Joo Jang, Suwon-si (KR); Hongkyu Seo, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 398 days.

(21) Appl. No.: 16/427,561

(22) Filed: May 31, 2019

(65) Prior Publication Data

US 2019/0367805 A1   Dec. 5, 2019

(30) Foreign Application Priority Data

May 31, 2018   (KR) ........................ 10-2018-0062960

(51) Int. Cl.
| | | |
|---|---|---|
| *C09K 11/06* | (2006.01) | |
| *H01L 51/00* | (2006.01) | |
| *H01L 51/50* | (2006.01) | |
| *H01L 33/06* | (2010.01) | |
| *C09K 11/02* | (2006.01) | |
| *B82Y 20/00* | (2011.01) | |

(52) U.S. Cl.
CPC ............ *C09K 11/06* (2013.01); *C09K 11/025* (2013.01); *H01L 33/06* (2013.01); *H01L 51/005* (2013.01); *H01L 51/502* (2013.01); *H01L 51/5012* (2013.01); *B82Y 20/00* (2013.01); *C09K 2211/1029* (2013.01); *C09K 2211/1044* (2013.01)

(58) Field of Classification Search
CPC ................................................... C09K 11/025
See application file for complete search history.

(56) References Cited

U.S. PATENT DOCUMENTS

| | | |
|---|---|---|
| 7,358,525 B2 | 4/2008 | Lee |
| 7,589,240 B2 | 9/2009 | Emrick et al. |
| 2006/0216759 A1 | 9/2006 | Naasani et al. |
| 2017/0362255 A1* | 12/2017 | Beard ................... C09K 11/025 |
| 2017/0362504 A1* | 12/2017 | Hirst .................... C09K 11/025 |
| 2018/0215695 A1 | 8/2018 | Chen |

FOREIGN PATENT DOCUMENTS

| | | |
|---|---|---|
| CN | 10295138 | * 2/2013 |
| CN | 106083573 A | 11/2016 |
| KR | 1020120053325 A | 5/2012 |
| KR | 1020120138165 A | 12/2012 |
| KR | 1020130062966 A | 6/2013 |
| KR | 101252615 B1 | 7/2013 |
| KR | 101400902 B1 | 5/2014 |
| KR | 1020170077944 A | 7/2017 |

OTHER PUBLICATIONS

Translation for CN 1029518, Feb. 13, 2013.*
C. Gianstate, "Surface Chemistry Control of Colloidal Quantum Dot Band Gap", J. Phys. Chem. C, 2018, 122, pp. 18110-18116, Jul. 13, 2018.*
Extended European Search Report dated Sep. 9, 2019, of the corresponding European Patent Application No. 19177578.2.

* cited by examiner

*Primary Examiner* — C Melissa Koslow
(74) *Attorney, Agent, or Firm* — Cantor Colburn LLP

(57) ABSTRACT

A semiconductor nanocrystal-ligand composite that includes a semiconductor nanocrystal and a ligand layer including an organic ligand coordinated on the surface of the semiconductor nanocrystal, wherein the organic ligand includes a moiety having a conjugation structure, and a first functional group (X) and a second functional group (Y) linked to the moiety having a conjugation structure, wherein the first functional group (X) is bound to the surface of the semiconductor nanocrystal and the second functional group (Y) is present at an ortho position with respect to the first functional group (X).

20 Claims, 4 Drawing Sheets

SEMICONDUCTOR NANOCRYSTAL-LIGAND COMPOSITE AND ELECTRONIC DEVICE INCLUDING COMPOSITE

CROSS-REFERENCE TO RELATED APPLICATION

This application claims priority to and the benefit of Korean Patent Application No. 10-2018-0062960 filed on May 31, 2018, and all the benefits accruing therefrom under 35 U.S.C. § 119, the content of which is incorporated herein in its entirety by reference.

BACKGROUND

1. Field

A semiconductor nanocrystal-ligand composite and an electronic device including the semiconductor nanocrystal-ligand composite are disclosed.

2. Description of the Related Art

A semiconductor nanocrystal (i.e., a quantum dot) may have different energy bandgaps by controlling sizes and compositions of nanocrystals, and thus may emit light of various wavelengths by photoluminescence or electroluminescence mechanism. As the semiconductor nanocrystal has a theoretical quantum yield (QY) of 100% and emits light having a high color purity (e.g., full width at half maximum (FWHM) of less than or equal to about 40 nm), the semiconductor nanocrystal as a light emitting material may have increased luminous efficiency and improved color reproducibility.

In a wet chemical method for the manufacture of a semiconductor nanocrystal, organic materials such as a dispersing agent are coordinated on the surface of semiconductor nanocrystal during crystal growth. As a result, semiconductor nanocrystals having uniformly controlled sizes and having good luminescence characteristics and stability may be provided.

However, these organic materials are insulating materials and thus may disturb flows of charges such as electrons, holes, and the like. Therefore, when semiconductor nanocrystals are applied to a device, the charge flows may be disturbed, which may deteriorate device efficiency or life-span and increase a driving voltage.

SUMMARY

An embodiment provides a semiconductor nanocrystal-ligand composite capable of improving charge mobility to improve device efficiency and life-span and reduce a driving voltage.

Another embodiment provides a method of manufacturing the semiconductor nanocrystal-ligand composite.

Another embodiment provides an electronic device including the semiconductor nanocrystal-ligand composite.

According to an embodiment, a semiconductor nanocrystal-ligand composite includes a semiconductor nanocrystal and a ligand layer including an organic ligand coordinated on the surface of the semiconductor nanocrystal, wherein the organic ligand comprises a moiety having a conjugation structure and a first functional group (X) and a second functional group (Y) linked to the moiety having a conjugation structure, wherein the first functional group (X) is bound to the surface of the semiconductor nanocrystal and the second functional group (Y) is present at an ortho position with respect to the first functional group (X).

The organic ligand may be a monomer or oligomer.

The moiety having the conjugation structure may include an aromatic ring group, wherein the aromatic ring group is a substituted or unsubstituted monocyclic aromatic ring group; a substituted or unsubstituted condensed polycyclic aromatic ring group; at least two substituted or unsubstituted monocyclic aromatic ring groups connected to each other by a linker, or at least two condensed polycyclic aromatic ring groups connected to each other by a linker.

The moiety having the conjugation structure may include an aromatic ring group, wherein the aromatic ring group is a substituted or unsubstituted C6 to C20 aryl group; a substituted or unsubstituted C2 to C20 heteroaryl group; or a substituted or unsubstituted C6 to C20 aryl group and a substituted or unsubstituted C2 to C20 heteroaryl group connected to each other by a linker.

The moiety having the conjugation structure may include an aromatic ring group, wherein the aromatic ring group is benzene, naphthalene, anthracene, phenanthrene, pyrene, perylene, fluorene, pentalene, pyrazole, imidazole, thiazole, triazole, carbazole, pyridine, pyridazine, pyrimidine, pyrazine, triazine, indazole, indolizine, benzimidazole, benzothiazole, benzothiophene, benzopyrene, isoquinoline, purine, or combination thereof connected to each other by a linker. The aromatic ring groups connected to each other by a linker may be the same or different.

The first functional group (X) may be a thiol group (—SH), an amine group, an amide group, an imine group, an imide group, a cyano group, a carboxyl group (—COOH), a sulfonic acid group (—SO$_3$H), a phosphine group, a phosphite group, a phosphonic acid group or a phosphonate group (—PO(OR)$_2$, wherein R is independently hydrogen or a C1 to C10 alkyl group), —OP(O)Cl$_2$, —POCl$_2$, —Si(OH)$_3$, —SiCl$_3$, —Si(OR)$_3$ (wherein OR is a C1 to C10 alkoxy group), a hydroxy group (—OH), an ether group (—ROR', wherein R is a C1 to C10 alkylene group and R' is a C1 to C10 alkyl group), —C(O)R (wherein R is a halogen or a C1 to C10 alkyl group), a carbazolyl group, —SO$_2$Cl, or a nitro group (—NO$_2$).

The second functional group (Y) may be a substituted or unsubstituted linear or branched C1 to C10 alkyl group, a substituted or unsubstituted linear or branched C2 to C10 alkenyl group, a substituted or unsubstituted linear or branched C2 to C10 alkynyl group, a substituted or unsubstituted C6 to C18 aryl group, or a substituted or unsubstituted C2 to C18 heteroaryl group.

The organic ligand may further include a third functional group (Z) present at a para position with respect to the first functional group.

The third functional group (Z) may be a substituted or unsubstituted linear or branched C1 to C10 alkyl group, a substituted or unsubstituted linear or branched C2 to C10 alkenyl group, a substituted or unsubstituted linear or branched C2 to C10 alkynyl group, a substituted or unsubstituted C6 to C18 aryl group, or a substituted or unsubstituted C2 to C18 heteroaryl group.

The organic ligand may be represented by Chemical Formula 1-1.

Chemical Formula 1-1

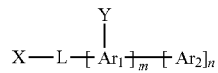

In Chemical Formula 1-1, $Ar_1$ and $Ar_2$ may independently be a substituted or unsubstituted monocyclic aromatic ring group; a substituted or unsubstituted condensed polycyclic aromatic ring group; at least two substituted or unsubstituted monocyclic aromatic ring groups connected to each other by a linker, or at least two substituted or unsubstituted condensed polycyclic aromatic ring groups connected to each other by a linker, L may be a single bond; a substituted or unsubstituted C1 to C30 alkylene group; or a substituted or unsubstituted C1 to C30 alkylene group including as a linker —O—, —$NR^a$—, —C(=O)—, —OC(=O)—, —$S(=O)_2$—, —$Si(R^bR^c)_2$—, —$C(=O)NR^d$—, or a combination thereof (wherein, $R^a$, $R^b$, $R^c$, and $R^d$ are independently hydrogen, a C1 to C10 alkyl group, a C2 to C10 alkenyl group, a C2 to C10 alkynyl group, a C6 to C18 aryl group, or a C2 to C18 heteroaryl group), X may be the first functional group bound to the surface of the semiconductor nanocrystal, Y may be the second functional group present at an ortho position with respect to the first functional group (X), m may be an integer ranging from 1 to 9, n may be an integer ranging from 0 to 8, and m+n may not be greater than 9.

$Ar_1$ and $Ar_2$ may independently be a substituted or unsubstituted C6 to C20 aryl group; a substituted or unsubstituted C2 to C20 heteroaryl group; at least two substituted or unsubstituted monocyclic aromatic ring groups connected to each other by a linker, or at least two substituted or unsubstituted condensed polycyclic aromatic ring groups connected to each other by a linker.

$Ar_1$ and $Ar_2$ may independently be benzene, naphthalene, anthracene, phenanthrene, pyrene, perylene, fluorene, pentalene, pyrazole, imidazole, thiazole, triazole, carbazole, pyridine, pyridazine, pyrimidine, pyrazine, triazine, indazole, indolizine, benzimidazole, benzothiazole, benzothiophene, benzopyrene, isoquinoline, purine, or a combination thereof connected to each other by a linker. The aromatic ring groups connected to each other by a linker may be the same or different.

The organic ligand may be represented by Chemical Formula 1-2.

Chemical Formula 1-2

In Chemical Formula 1-2, $Ar_1$ and $Ar_2$ may independently be a substituted or unsubstituted monocyclic aromatic ring group; a substituted or unsubstituted condensed polycyclic aromatic ring group; at least two substituted or unsubstituted monocyclic aromatic ring groups connected to each other by a linker, or at least two substituted or unsubstituted condensed polycyclic aromatic ring groups connected to each other by a linker, L may be a single bond; a substituted or unsubstituted C1 to C30 alkylene group; or a substituted or unsubstituted C1 to C30 alkylene group including as a linker —O—, —$NR^a$—, —C(=O)—, —OC(=O)—, —$S(=O)_2$—, —$Si(R^bR^c)_2$—, —$C(=O)NR^d$—, or a combination thereof (wherein, $R^a$, $R^b$, $R^c$, and $R^d$ are independently hydrogen, a C1 to C10 alkyl group, a C2 to C10 alkenyl group, a C2 to C10 alkynyl group, a C6 to C18 aryl group, or a C2 to C18 heteroaryl group), X may be a first functional group bound to the surface of the semiconductor nanocrystal, Y may be a second functional group present at an ortho position with respect to the first functional group (X), Z may be a third functional group present at a para position with respect to the first functional group (X), m may be an integer ranging from 1 to 9, n may be an integer ranging from 0 to 8, and m+n may not be greater than 9.

The organic ligand may be represented by Chemical Formula 2-1.

Chemical Formula 2-1

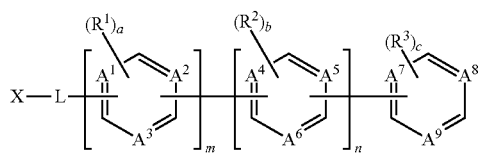

In Chemical Formula 2-1,

L may be a single bond; a substituted or unsubstituted C1 to C30 alkylene group; or a substituted or unsubstituted C1 to C30 alkylene group including as a linker —O—, —$NR^a$—, —C(=O)—, —OC(=O)—, —$S(=O)_2$—, —$Si(R^bR^c)_2$—, —$C(=O)NR^d$—, or a combination thereof (wherein, $R^a$, $R^b$, $R^c$, and $R^d$ are independently hydrogen, a C1 to C10 alkyl group, a C2 to C10 alkenyl group, a C2 to C10 alkynyl group, a C6 to C18 aryl group, or a C2 to C18 heteroaryl group), $A^1$ to $A^9$ may independently be $CR^e$ or N (wherein, $R^e$ is hydrogen, a substituted or unsubstituted linear or branched C1 to C10 alkyl group, a substituted or unsubstituted linear or branched C2 to C10 alkenyl group, a substituted or unsubstituted linear or branched C2 to C10 alkynyl group, a substituted or unsubstituted C6 to C18 aryl group, or a substituted or unsubstituted C2 to C18 heteroaryl group), provided that one group or two groups present at an ortho position with respect to the functional group (-L-X) of $A^1$ to $A^3$ is $CR^e$ (wherein, $R^e$ is a substituted or unsubstituted linear or branched C1 to C10 alkyl group, a substituted or unsubstituted linear or branched C2 to C10 alkenyl group, a substituted or unsubstituted linear or branched C2 to C10 alkynyl group, a substituted or unsubstituted C6 to C18 aryl group, or a substituted or unsubstituted C2 to C18 heteroaryl group), X may be a first functional group bound to the surface of the semiconductor nanocrystal, $R^1$, $R^2$, and $R^3$ may independently be hydrogen, a C1 to C10 alkyl group, a C2 to C10 alkenyl group, a C2 to C10 alkynyl group, a C6 to C18 aryl group, or a C2 to C18 heteroaryl group, or optionally, $R^e$ of $CR^e$ and one of $R^1$, $R^2$, or $R^3$ may be connected with each other to form an aromatic ring group, provided that $R^b$ and one of $R^1$, $R^2$, or $R^3$ are adjacent to one another, a and b may be an integer ranging from 0 to 1, c may be an integer ranging from 0 to 2, m may be an integer ranging from 1 to 9, n may be an integer ranging from 0 to 8, and m+n may not be greater than 9.

The organic ligand may be represented by Chemical Formula 2-2.
Chemical Formula 2-2

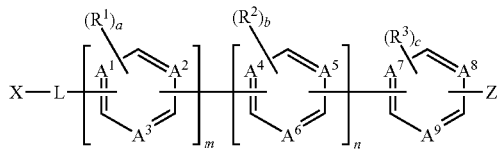

In Chemical Formula 2-2,

L may be a single bond; a substituted or unsubstituted C1 to C30 alkylene group; or a substituted or unsubstituted C1 to C30 alkylene group including as a linker —O—, —NR$^a$—, —C(=O)—, —OC(=O)—, —S(=O)$_2$—, —Si(R$^b$R$^c$)$_2$—, —C(=O)NR$^d$—, or a combination thereof (wherein, R$^a$, R$^b$, R$^c$, and R$^d$ are independently hydrogen, a C1 to C10 alkyl group, a C2 to C10 alkenyl group, a C2 to C10 alkynyl group, a C6 to C18 aryl group, or a C2 to C18 heteroaryl group), A$^1$ to A$^9$ may independently be CR$^e$ or N, (wherein, R$^e$ is hydrogen, a substituted or unsubstituted linear or branched C1 to C10 alkyl group, a substituted or unsubstituted linear or branched C2 to C10 alkenyl group, a substituted or unsubstituted linear or branched C2 to C10 alkynyl group, a substituted or unsubstituted C6 to C18 aryl group, or a substituted or unsubstituted C2 to C18 heteroaryl group), provided that one group or two groups present at an ortho position with respect to the functional group (-L-X) of A$^1$ to A$^3$ is CR$^e$ (wherein, R$^e$ is a substituted or unsubstituted linear or branched C1 to C10 alkyl group, a substituted or unsubstituted linear or branched C2 to C10 alkenyl group, a substituted or unsubstituted linear or branched C2 to C10 alkynyl group, a substituted or unsubstituted C6 to C18 aryl group, or a substituted or unsubstituted C2 to C18 heteroaryl group), X may be a first functional group bound to the surface of the semiconductor nanocrystal, Z may be a third functional group present at a para position with respect to the first functional group (X), R$^1$, R$^2$, and R$^3$ may independently be hydrogen, a C1 to C10 alkyl group, a C2 to C10 alkenyl group, a C2 to C10 alkynyl group, a C6 to C18 aryl group, or a C2 to C18 heteroaryl group, optionally, R$^e$ of CR$^e$ and one of R$^1$, R$^2$, and R$^3$ may be linked with each other to form an aromatic ring group, a, b, and c may independently be an integer ranging from 0 to 1, m may be an integer ranging from 1 to 9, n may be an integer ranging from 0 to 8, and m+n may not be greater than 9.

The ligand layer may further include a second organic ligand, wherein the second organic ligand is RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR', RPO(OH)$_2$, R$_2$POOH, or a combination thereof (wherein, R and R' are each independently a substituted or unsubstituted C1 to C24 alkyl group, a substituted or unsubstituted C2 to C24 alkenyl group, or a substituted or unsubstituted C2 to C24 alkynyl group).

The semiconductor nanocrystal may be a Group II-VI compound, a Group III-V compound, a Group IV-VI compound, a Group IV element or compound, a Group I-III-VI compound, a Group I-II-IV-VI compound, or a combination thereof.

The semiconductor nanocrystal-ligand composite may further include a polyvalent metal compound.

The polyvalent metal compound may include Zn, In, Ga, Mg, Ca, Sc, Sn, Ti, V, Cr, Mn, Fe, Co, Ni, Cu, Sr, Y, Zr, Nb, Mo, Cd, Ba, Au, Hg, Tl, or a combination thereof.

The polyvalent metal compound may be an organometallic compound, an organic salt, an inorganic salt, or a combination thereof.

Another embodiment provides an electronic device including a first electrode and a second electrode facing each other; and an emission layer disposed between the first electrode and the second electrode and including a plurality of semiconductor nanocrystal-ligand composites, wherein the plurality of semiconductor nanocrystal-ligand composites include the aforementioned semiconductor nanocrystal.

The electronic device may be a light emitting diode (LED), an organic light emitting diode (OLED), a sensor, a photodetector, an imaging sensor, a solar cell, or a liquid crystal display (LCD) device.

The semiconductor nanocrystal-ligand composite may improve charge mobility to improve device efficiency and life-span, and reduce a driving voltage. The semiconductor nanocrystal-ligand composite may be applied to various display devices and biological labeling (biosensor, bio imaging), a photo detector, a solar cell, a polymer composite, or an inorganic hybrid composite.

DETAILED DESCRIPTION

Figure 1:
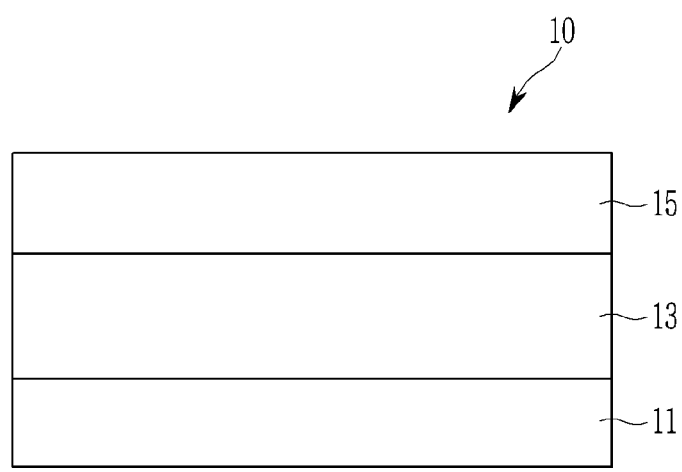
FIG. 1 is a schematic cross-sectional view showing a light emitting device according to an embodiment.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally used dictionary may not be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

As used herein, when a definition is not otherwise provided, "substituted" may refer to a compound or a moiety wherein a hydrogen atom thereof is replaced by a C1 to C30 alkyl group, a C2 to C30 alkynyl group, a C6 to C30 aryl group, a C7 to C30 arylalkyl group, a C1 to C30 alkoxy group, a C1 to C30 heteroalkyl group, a C3 to C30 heteroarylalkyl group, a C3 to C30 cycloalkyl group, a C3 to C15 cycloalkenyl group, a C6 to C30 cycloalkynyl group, a C2 to C30 heterocycloalkyl group, a C2 to C30 heterocycloalkenyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$)), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), or a phosphoric acid group (—PO$_3$H$_2$) or a salt thereof (—PO$_3$MH or —PO$_3$M$_2$, wherein M is an organic or inorganic cation), or a combination thereof.

The number of carbons in a substituent is included in the total number of carbons in the group, moiety, or compound.

As used herein, "monocyclic aromatic ring group" may refer to a cyclic group providing a conjugation structure (e.g., a C6 to C12 aryl group or a C6 to C8 aryl group) or a heterocyclic group providing a conjugation structure (e.g., a C2 to C12 heteroaryl group or a C2 to C4 heteroaryl group).

As used herein, "condensed polycyclic aromatic ring group" may refer to a cyclic group formed by condensing at least two substituted or unsubstituted monocyclic aromatic ring groups, for example a C8 to C20 aryl group, for example a C8 to C15 aryl group, or a C4 to C20 heteroaryl group, for example a C4 to C15 heteroaryl group.

The terms "C1 to C30 alkyl group" and "C1 to C10 alkyl group" as used herein refer to a linear or branched saturated aliphatic hydrocarbon monovalent group having 1 to 30 carbon atoms and 1 to 10 carbon atoms, respectively. Non-limiting examples thereof include a methyl group, an ethyl group, a propyl group, an isobutyl group, a sec-butyl group, a tert-butyl group, a pentyl group, an isoamyl group, and a hexyl group. The terms "C1 to C30 alkylene group" and "C1 to C10 alkylene group" as used herein refers to a divalent group having the same structure as the C1 to C30 alkyl group and the C1 to C10 alkyl group, respectively.

The terms "C1 to C30 alkoxy group," "C1 to C10 alkoxy group," and "C1 to C6 alkoxy group" as used herein refer to a monovalent group represented by —OA$_{101}$, wherein A$_{101}$ is a C1 to C30 alkyl group, a C1 to C10 alkyl group, and a C1 to C6 alkyl group, respectively. Non-limiting examples thereof include a methoxy group, an ethoxy group, and an isopropyloxy group.

The terms "C2 to C24 alkenyl group" and "C2 to C10 alkenyl group" as used herein refer to a hydrocarbon group formed by substituting a carbon-carbon double bond in the middle or at the terminus of the C2 to C24 alkyl group and the C2 to C10 alkyl group, respectively. Non-limiting examples thereof include an ethenyl group, a propenyl group, and a butenyl group.

The terms "C2 to C24 alkynyl group" and "C2 to C10 alkynyl group" as used herein refer to a hydrocarbon group formed by substituting a carbon-carbon triple bond in the middle or at the terminus of the C2 to C24 alkyl group and the C2 to C10 alkyl group, respectively. Examples thereof include an ethynyl group, and a propynyl group.

The terms "C6 to C30 aryl group," "C6 to C20 aryl group," and "C6 to C18 aryl group" as used herein refer to a monovalent group having a carbocyclic aromatic system having 6 to 30, 6 to 20, and 6 to 18 carbon atoms, respectively. Non-limiting examples thereof include a phenyl group, a naphthyl group, an anthracenyl group, a phenanthrenyl group, a pyrenyl group, and a chrysenyl group. When the C6 to C30 aryl group, the C6 to C20 aryl group, and the C6 to C18 aryl group each include two or more rings, the rings may be fused to each other or may be joined by a single bond.

The terms "C2 to C30 heteroaryl group," "C2 to C20 heteroaryl group," and "C2 to C18 heteroaryl group" as used herein refer to a monovalent group having a heterocyclic aromatic system that has N, O, P, Si, Se or S as a ring-forming atom, and 2 to 30, 2 to 20, and 2 to 18 carbon atoms, respectively. Non-limiting examples thereof include a pyridinyl group, a pyrimidinyl group, a pyrazinyl group, a pyridazinyl group, a triazinyl group, a quinolinyl group, and an isoquinolinyl group. When the C2 to C30 heteroaryl group, the C2 to C20 heteroaryl group and the C2 to C18 heteroaryl group each include two or more rings, the rings may be fused to each other or connected to each other by a single bond. The term "C3 to C30 cycloalkyl group" as used herein refers to a monovalent saturated hydrocarbon monocyclic group having 3 to 30 carbon atoms, and non-limiting examples thereof include a cyclopropyl group, a cyclobutyl group, a cyclopentyl group, a cyclohexyl group, and a cycloheptyl group.

The term "C2 to C30 heterocycloalkyl group" as used herein refers to a monovalent saturated monocyclic group having N, O, P, Si, Se or S as a ring-forming atom and 2 to 30 carbon atoms, and non-limiting examples thereof include a tetrahydrofuranyl group and a tetrahydrothiophenyl group.

The term "C3 to C15 cycloalkenyl group" as used herein refers to a monovalent monocyclic group that has 3 to 15 carbon atoms and a carbon-carbon double bond in the ring thereof and no aromaticity, and non-limiting examples thereof include a cyclopentenyl group, a cyclohexenyl group, and a cycloheptenyl group.

The term "C6 to C30 cycloalkynyl group" as used herein refers to a monovalent monocyclic group that has 6 to 30 carbon atoms and a carbon-carbon triple bond in the ring thereof and no aromaticity, and non-limiting examples thereof include a cyclopentenyl group, a cyclohexenyl group, and a cycloheptenyl group.

The term "C2 to C10 heterocycloalkenyl group" as used herein refers to a monovalent monocyclic group that has N, O, P, Si, Se or S as a ring-forming atom, 2 to 10 carbon atoms, and a carbon-carbon double bond in its ring. Non-limiting examples of the C2-C10 heterocycloalkenyl group include a 2,3-dihydrofuranyl group, and a 2,3-dihydrothiophenyl group.

The term "C7 to C30 arylalkyl group" refers to an aryl group linked via an alkylene moiety. The specified number of carbon atoms (e.g., C7 to C30) means the total number of carbon atoms present in both the aryl and the alkylene moieties.

The term "C3 to C30 heteroarylalkyl group" refers to a heteroaryl group linked via an alkylene moiety. The specified number of carbon atoms (e.g., C3 to C30) means the total number of carbon atoms present in both the heteroaryl and the alkylene moieties, with the remaining ring atoms being heteroatoms.

As used herein, "Group" may refer to a group of Periodic Table.

As used herein, "Group II" may refer to Group IIA and Group IIB, and examples of Group II metal may be Cd, Zn, Hg, and Mg, but are not limited thereto.

As used herein, "Group III" may refer to Group IIIA and Group IIIB, and examples of Group III metal may be Al, In, Ga, and Tl, but are not limited thereto.

As used herein, "Group IV" may refer to Group IVA and Group IVB, and examples of a Group IV metal may be Si, Ge, and Sn, but are not limited thereto. As used herein, "metal" may include a semi-metal such as Si.

As used herein, "Group I" may refer to Group IA and Group IB, and examples may include Li, Na, K, Rb, and Cs, but are not limited thereto.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

A semiconductor nanocrystal (also referred to as a quantum dot) may absorb light from an excitation source and emit light corresponding to its energy bandgap. For example, semiconductor nanocrystals may have narrower energy bandgaps as the particle size increases and light emitting wavelengths may increase. Since semiconductor nanocrystals have merits such as high luminous efficiency (quantum yield), high color purity, high stability, wavelength control capability (spectral tenability), and the like, they have attracted attention as a light emitting material in various fields such as display devices, energy devices, and bioluminescence devices.

An organic ligand is coordinated on the surface of semiconductor nanocrystals to ensure dispersibility of semiconductor nanocrystals. Because these conventional organic ligands are insulating materials, they may inhibit flows of electrons and holes. Therefore, the flows of electrons or holes may be improved by coordinating an organic ligand including a moiety having a conjugation structure capable of moving electrons or holes well on the surface of the semiconductor nanocrystal. Also, when an organic ligand already present in semiconductor nanocrystals is substituted with an organic ligand containing a moiety having the conjugation structure, a precipitation phenomenon may occur during a substitution process. Accordingly, in order to prevent such a precipitation phenomenon, the organic ligand including a second functional group (Y) present at an ortho position with respect to the first functional group (X) bound to the surface of the semiconductor nanocrystals is coordinated on the surface of the semiconductor nanocrystals. In this case, the organic ligand including the moiety having a stable conjugation structure may be substituted for an insulating organic ligand existing on the surface of the semiconductor nanocrystals, and the precipitation phenomenon during the substitution process may be prevented.

According to an embodiment, a semiconductor nanocrystal-ligand composite includes a semiconductor nanocrystal and a ligand layer including an organic ligand coordinated on the surface of the semiconductor nanocrystal, wherein the organic ligand includes a moiety having a conjugation structure and a first functional group (X) and a second functional group (Y) (directly or indirectly) linked to the moiety having a conjugation structure, wherein the first functional group (X) is bound to the surface of the semiconductor nanocrystal and the second functional group (Y) is present at an ortho position with respect to the first functional group (X).

The organic ligand may be a monomer or oligomer. Herein, the oligomer may refer to a polymerized form of 2 to 10, for example 2 to 8 or 2 to 5 monomers. When the organic ligand is a polymer, the polymer having the conjugation structure may emit light in a visible light region, which may deteriorate color purity of the semiconductor nanocrystals. Thus, the organic ligand does not include a polymer.

In an embodiment, the moiety having the conjugation structure may include an aromatic ring group including a substituted or unsubstituted monocyclic aromatic ring group; a substituted or unsubstituted condensed polycyclic aromatic ring group; at least two substituted or unsubstituted monocyclic aromatic ring groups connected to each other by a linker, or at least two substituted or unsubstituted condensed polycyclic aromatic ring groups connected to each other by a linker.

The moiety having the conjugation structure may include a substituted or unsubstituted C6 to C20 aryl group; a substituted or unsubstituted C2 to C20 heteroaryl group; a substituted or unsubstituted C6 to C20 aryl group and a substituted or unsubstituted C2 to C20 heteroaryl group connected to each other by a linker.

More specifically, the moiety having the conjugation structure may include benzene, naphthalene, anthracene, phenanthrene, pyrene, perylene, fluorene, pentalene, pyrazole, imidazole, thiazole, triazole, carbazole, pyridine, pyridazine, pyrimidine, pyrazine, triazine, indazole, indolizine, benzimidazole, benzothiazole, benzothiophene, benzopyrene, isoquinoline, and purine, or an aromatic ring group including at least two of the aforementioned aromatic ring groups connected to each other by a linker. The aromatic ring groups connected to each other by a linker can be the same or different.

The linker connecting the at least two aromatic ring groups may be a single bond, $—(CR^aR^b)_{n1}—$, $—O—$, $—S—$, $—Se—$, $—C(=O)—$, $—C(=O)O—$, $—OC(=O)—$, $—N=$, $—NR^c—$, $—SiR^dR^e—$ or $—GeR^fR^g—$, wherein $R^a$ to $R^g$ are independently hydrogen, a substituted or unsubstituted C1 to C30 alkyl group, a substituted or unsubstituted C6 to C30 aryl group, a substituted or unsubstituted C2 to C30 heteroaryl group, a substituted or unsubstituted C1 to C6 alkoxy group, a halogen, or a cyano group, and n1 may be an integer of 1 to 10.

The organic ligand including the moiety having the conjugation structure may improve current injection characteristics and life-span of semiconductor nanocrystals, may improve mobility of electrons and holes, and may reduce a driving voltage of the device by lowering a resistance, and thus efficiency and life-span may be greatly improved.

The first functional group (X) is a functional group bound to the surface of the semiconductor nanocrystal and may be a thiol group (—SH), an amine group, an amide group, an imine group, an imide group, a cyano group, a carboxyl group (—COOH), a sulfonic acid group (—SO₃H), a phosphine group, a phosphite group, a phosphonic acid group or a phosphonate group (—PO(OR)₂, wherein R is hydrogen or a C1 to C10 alkyl group), —OP(O)Cl₂, —POCl₂, —Si(OH)₃, —SiCl₃, —Si(OR)₃ (wherein OR is a C1 to C10 alkoxy group), a hydroxy group (—OH), an ether group (—ROR', wherein R is a C1 to C10 alkylene group and R' is a C1 to C10 alkyl group), —C(O)R (wherein R is a halogen or a C1 to C10 alkyl group), a carbazolyl group, —SO₂Cl, or a nitro group (—NO₂). The halogen may be F, Cl, Br, or I.

The second functional group (Y) is present at an ortho position with respect to the first functional group (X) and thus it is possible to prevent the semiconductor nanocrystal from being precipitated during a substitution process of the organic ligand. When the first functional group (X) is connected to each other by a linker with the moiety having the conjugation structure, the second functional group (Y) may be present at an ortho position with respect to a linker linked with the moiety having the conjugation structure.

The second functional group (Y) may be a substituted or unsubstituted linear or branched C1 to C10 alkyl group, a substituted or unsubstituted linear or branched C2 to C10 alkenyl group, a substituted or unsubstituted linear or branched C2 to C10 alkynyl group, a substituted or unsubstituted C6 to C18 aryl group, or a substituted or unsubstituted C2 to C18 heteroaryl group. The heteroaryl group may be a carbazolyl group, a thiophenyl group, a selenophenyl group, a purinyl group, a pyridyl group, a pyrimidinyl group, a pyrrolyl group, a triazinyl group, an imidazolyl group, a quinolinyl group, an isoquinolinyl group, and the like.

The organic ligand may further include a third functional group (Z) at a para position with respect to the first functional group (X). The third functional group (Z) may improve solvent dispersibility of the semiconductor nanocrystals. Herein, the para position may refer to a symmetrical position with respect to the first functional group (X) in the center of the moiety having the conjugation structure.

The third functional group may be a substituted or unsubstituted linear or branched C1 to C10 alkyl group, a substituted or unsubstituted linear or branched C2 to C10 alkenyl group, a substituted or unsubstituted linear or branched C2 to C10 alkynyl group, a substituted or unsubstituted C6 to C18 aryl group, or a substituted or unsubstituted C2 to C18 heteroaryl group.

The heteroaryl group may be a carbazolyl group, a thiophenyl group, a selenophenyl group, a purinyl group, a pyridyl group, a pyrimidinyl group, a pyrrolyl group, a triazinyl group, an imidazolyl group, a quinolinyl group, an isoquinolinyl group, and the like.

The second functional group (Y) and the third functional group (Z) may be the same or different. The second functional group (Y) and the third functional group (Z) may improve stability of the semiconductor nanocrystals during or after the substitution process of the organic ligand.

The organic ligand may be represented by Chemical Formula 1-1.

Chemical Formula 1-1

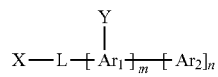

In Chemical Formula 1-1, $Ar_1$ and $Ar_2$ may independently be a substituted or unsubstituted monocyclic aromatic ring group; a substituted or unsubstituted condensed polycyclic aromatic ring group; at least two substituted or unsubstituted monocyclic aromatic ring groups connected to each other by a linker, or at least two substituted or unsubstituted condensed polycyclic aromatic ring groups connected to each other by a linker, L may be a single bond, a substituted or unsubstituted C1 to C30 alkylene group, or a substituted or unsubstituted C1 to C30 alkylene group including as a linker —O—, —NR$^a$—, —C(=O)—, —OC(=O)—, —S(=O)₂—, —Si(R$^b$R$^c$)₂—, —C(=O)NR$^d$—, or a combination thereof (wherein, R$^a$, R$^b$, R$^c$, and R$^d$ are independently hydrogen, a C1 to C10 alkyl group, a C2 to C10 alkenyl group, a C2 to C10 alkynyl group, a C6 to C18 aryl group, or a C2 to C18 heteroaryl group), X may be a first functional group bound to the surface of the semiconductor nanocrystal, Y may be a second functional group present at an ortho position with respect to the first functional group (X), m may be an integer ranging from 1 to 9, n may be an integer ranging from 0 to 8, and m+n may not be greater than 9.

$Ar_1$ and $Ar_2$ may independently be a substituted or unsubstituted C6 to C20 aryl group, for example substituted or unsubstituted a C6 to C14 aryl group; a substituted or unsubstituted C2 to C20 heteroaryl group, for example a substituted or unsubstituted C2 to C14 heteroaryl group; a substituted or unsubstituted C6 to C20 aryl group, for example a substituted or unsubstituted C6 to C14 aryl group and a substituted or unsubstituted C2 to C20 heteroaryl group, for example a substituted or unsubstituted C2 to C14 heteroaryl group connected to each other by a linker.

$Ar_1$ and $Ar_2$ may independently be benzene, naphthalene, anthracene, phenanthrene, pyrene, perylene, fluorene, pentalene, pyrazole, imidazole, thiazole, triazole, carbazole, pyridine, pyridazine, pyrimidine, pyrazine, triazine, indazole, indolizine, benzimidazole, benzothiazole, benzothiophene, benzopyrene, isoquinoline, purine, or a combination thereof connected to each other by a linker. The aromatic ring groups connected to each other by a linker can be the same or different. A hydrogen of these $Ar_1$ and $Ar_2$ groups may be replaced by a C1 to C10 alkyl group, a C1 to C10 aryl group, or a combination thereof.

The organic ligand represented by Chemical Formula 1-1 including $Ar_1$ and $Ar_2$ having a conjugation structure may improve current injection characteristics and life-span of semiconductor nanocrystals, may improve mobility of electrons and holes, and may reduce a driving voltage of the device by lowering a resistance, and thus efficiency and life-span may be greatly improved. In addition, the second functional group (Y) present at an ortho position with respect to the first functional group (X) may prevent the semiconductor nanocrystals from precipitating during a substitution process of the organic ligand, thereby improving dispersibility.

The organic ligand may be represented by Chemical Formula 1-2.
Chemical Formula 1-2

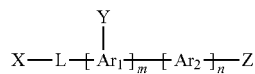

In Chemical Formula 1-2, $Ar_1$ and $Ar_2$ may independently be a substituted or unsubstituted monocyclic aromatic ring group; a substituted or unsubstituted condensed polycyclic aromatic ring group; at least two substituted or unsubstituted monocyclic aromatic ring groups connected to each other by a linker, at least two substituted or unsubstituted condensed polycyclic aromatic ring groups connected to each other by a linker, L may be a single bond; a substituted or unsubstituted C1 to C30 alkylene group; or a substituted or unsubstituted C1 to C30 alkylene group including as a linker —O—, —$NR^a$—, —C(=O)—, —OC(=O)—, —S(=O)$_2$—, —Si($R^b R^c$)$_2$—, —C(=O)$NR^d$—, or a combination thereof (wherein, $R^a$, $R^b$, $R^c$, and $R^d$ are independently hydrogen, a C1 to C10 alkyl group, a C2 to C10 alkenyl group, a C2 to C10 alkynyl group, a C6 to C18 aryl group, or a C2 to C18 heteroaryl group), X may be a first functional group bound to the surface of the semiconductor nanocrystal, Y may be a second functional group present at an ortho position with respect to the first functional group (X), Z may be a third functional group present at a para position with respect to the first functional group (X), m may be an integer ranging from 1 to 9, n is an integer ranging from 0 to 8, and m+n may not be greater than 9.

The organic ligand represented by Chemical Formula 1-2 including $Ar_1$ and $Ar_2$ having a conjugation structure may improve current injection characteristics and life-span of semiconductor nanocrystals, may improve mobility of electrons and holes, and may reduce a driving voltage of the device by lowering a resistance, and thus efficiency and life-span may be greatly improved. In addition, the second functional group (Y) present at an ortho position with respect to the first functional group (X) may prevent the semiconductor nanocrystals from precipitating during a substitution process of the organic ligand, thereby improving dispersibility. In addition, solvent dispersibility of the semiconductor nanocrystals may be improved by including the third functional group (Z) at the para position with respect to the first functional group (X).

The organic ligand may be represented by Chemical Formula 2-1.
Chemical Formula 2-1

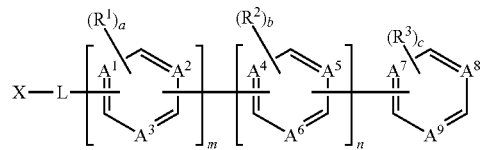

In Chemical Formula 2-1,

L may be a single bond; a substituted or unsubstituted C1 to C30 alkylene group; or a substituted or unsubstituted C1 to C30 alkylene group including as a linker —O—, —$NR^a$—, —C(=O)—, —OC(=O)—, —S(=O)$_2$—, —Si($R^b R^c$)$_2$—, —C(=O)$NR^d$—, or a combination thereof (wherein, $R^a$, $R^b$, $R^c$, and $R^d$ are independently hydrogen, a C1 to C10 alkyl group, a C2 to C10 alkenyl group, a C2 to C10 alkynyl group, a C6 to C18 aryl group, or a C2 to C18 heteroaryl group), $A^1$ to $A^9$ may independently be $CR^e$ or N (wherein, $R^e$ is hydrogen, a substituted or unsubstituted linear or branched C1 to C10 alkyl group, a substituted or unsubstituted linear or branched C2 to C10 alkenyl group, a substituted or unsubstituted linear or branched C2 to C10 alkynyl group, a substituted or unsubstituted C6 to C18 aryl group, or a substituted or unsubstituted C2 to C18 heteroaryl group), provided that one group or two groups present at an ortho position with respect to the functional group (-L-X) of $A^1$ to $A^3$ is $CR^e$ (wherein, $R^e$ is a substituted or unsubstituted linear or branched C1 to C10 alkyl group, a substituted or unsubstituted linear or branched C2 to C10 alkenyl group, a substituted or unsubstituted linear or branched C2 to C10 alkynyl group, a substituted or unsubstituted C6 to C18 aryl group, or a substituted or unsubstituted C2 to C18 heteroaryl group), X may be a first functional group bound to the surface of the semiconductor nanocrystal, $R^1$, $R^2$, and $R^3$ may independently be hydrogen, a C1 to C10 alkyl group, a C2 to C10 alkenyl group, a C2 to C10 alkynyl group, a C6 to C18 aryl group, or a C2 to C18 heteroaryl group, optionally, $R^e$ of $CR^e$ and one of $R^1$, $R^2$, and $R^3$ may be linked with each other to form an aromatic ring group, a and b may be an integer ranging from 0 to 1, c may be an integer ranging from 0 to 2, m may be an integer ranging from 1 to 9, n may be an integer ranging from 0 to 8, and m+n may not be greater than 9.

The organic ligand represented by Chemical Formula 2-1 having a conjugation structure may improve current injection characteristics and life-span of semiconductor nanocrystals, may improve mobility of electrons and holes, and may reduce a driving voltage of the device by lowering a resistance, and thus efficiency and life-span may be greatly improved. In addition, the second functional group (Y) present at an ortho position with respect to the first functional group (X) may prevent the semiconductor nanocrystals from precipitating during a substitution process of the organic ligand, thereby improving dispersibility.

The organic ligand may be represented by Chemical Formula 2-2.

Chemical Formula 2-2

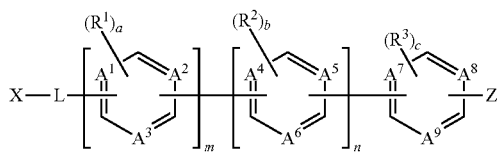

In Chemical Formula 2-2,

L may be a single bond; a substituted or unsubstituted C1 to C30 alkylene group; or a substituted or unsubstituted C1 to C30 alkylene group including as a linker —O—, —$NR^a$—, —C(=O)—, —OC(=O)—, —S(=O)$_2$—, —Si($R^bR^c$)$_2$—, —C(=O)$NR^d$—, or a combination thereof (wherein, $R^a$, $R^b$, $R^c$, and $R^d$ are independently hydrogen, a C1 to C10 alkyl group, a C2 to C10 alkenyl group, a C2 to C10 alkynyl group, a C6 to C18 aryl group, or a C2 to C18 heteroaryl group), $A^1$ to $A^9$ may independently be $CR^e$ or N, (wherein, $R^e$ is hydrogen, a substituted or unsubstituted linear or branched C1 to C10 alkyl group, a substituted or unsubstituted linear or branched C2 to C10 alkenyl group, a substituted or unsubstituted linear or branched C2 to C10 alkynyl group, a substituted or unsubstituted C6 to C18 aryl group, or a substituted or unsubstituted C2 to C18 heteroaryl group), provided that one group or two groups present at an ortho position with respect to the functional group (-L-X) of $A^1$ to $A^3$ is $CR^e$ (wherein, $R^e$ is a substituted or unsubstituted linear or branched C1 to C10 alkyl group, a substituted or unsubstituted linear or branched C2 to C10 alkenyl group, a substituted or unsubstituted linear or branched C2 to C10 alkynyl group, a substituted or unsubstituted C6 to C18 aryl group, or a substituted or unsubstituted C2 to C18 heteroaryl group), X may be a first functional group bound to the surface of the semiconductor nanocrystal, Z may be a third functional group present at a para position with respect to the first functional group (X), $R^1$, $R^2$, and $R^3$ may independently be hydrogen, a C1 to C10 alkyl group, a C2 to C10 alkenyl group, a C2 to C10 alkynyl group, a C6 to C18 aryl group, or a C2 to C18 heteroaryl group, optionally, $R^e$ of $CR^e$ and one of $R^1$, $R^2$, and $R^3$ may be linked with each other to form an aromatic ring group, a, b, and c may each independently be an integer ranging from 0 to 1, m may be an integer ranging from 1 to 9, n may be an integer ranging from 0 to 8, and m+n may not be greater than 9.

The organic ligand represented by Chemical Formula 2-2 having a conjugation structure may improve current injection characteristics and life-span of semiconductor nanocrystals, may improve mobility of electrons and holes, and may reduce a driving voltage of the device by lowering a resistance, and thus efficiency and life-span may be greatly improved. In addition, the second functional group (Y) present at an ortho position with respect to the first functional group (X) may prevent the semiconductor nanocrystals from being precipitated during a substitution process of the organic ligand, thereby improving dispersibility. In addition, solvent dispersibility of the semiconductor nanocrystals may be improved by including the third functional group (Z) at a para position with respect to the first functional group (X).

The second functional group (Y) and the third functional group (Z) may be the same or different.

Specific examples of the organic ligand may include organic ligands represented by Chemical Formula 3-1-A to 3-5-G, but are not limited thereto.

Chemical Formula 3-1-A to 3-1-D

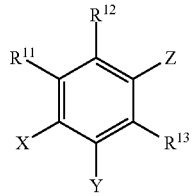

Formula 3-1-A

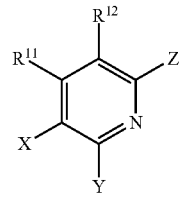

Formula 3-1-B

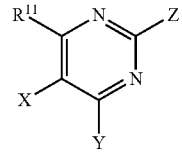

Formula 3-1-C

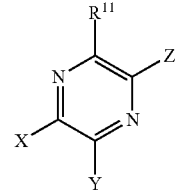

Formula 3-1-D

In Chemical Formulae 3-1-A to 3-1D,

X may be a first functional group bound to the surface of the semiconductor nanocrystal, Y may be a second functional group present at an ortho position with respect to the first functional group (X), Z may be a third functional group present at a para position with respect to the first functional group (X), and $R^{11}$, $R^{12}$, and $R^{13}$ may independently be hydrogen, a C1 to C10 alkyl group, a C2 to C10 alkenyl group, a C2 to C10 alkynyl group, a C6 to C18 aryl group or a C2 to C18 heteroaryl group, or optionally $R^{11}$ and $R^{12}$ may be linked with each other to form an aromatic ring group.

Chemical Formula 3-2-A to 3-2-E

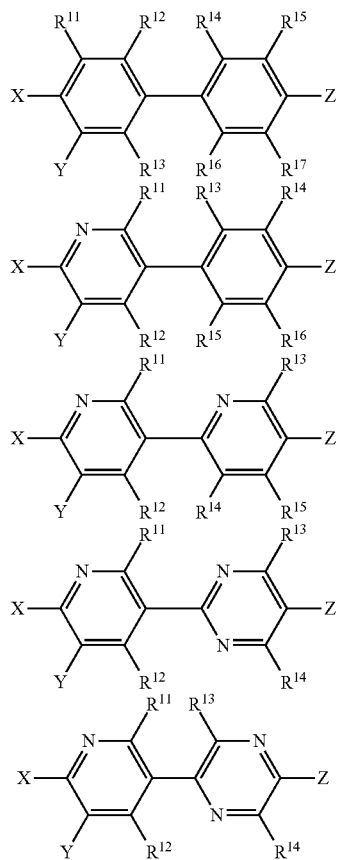

In Chemical Formula 3-2-A to 3-2-E,

X may be a first functional group bound to the surface of the semiconductor nanocrystal, Y may be a second functional group present at an ortho position with respect to the first functional group (X), Z may be a third functional group present at a para position with respect to the first functional group (X), and $R^{11}$, $R^{12}$, $R^{13}$, $R^{14}$, $R^{15}$, $R^{16}$, and $R^{17}$ may independently be hydrogen, a C1 to C10 alkyl group, a C2 to C10 alkenyl group, a C2 to C10 alkynyl group, a C6 to C18 aryl group, or a C2 to C18 heteroaryl group, or optionally two adjacent substituents of $R^{11}$, $R^{12}$, $R^{13}$, $R^{14}$, $R^{15}$, $R^{16}$, and $R^{17}$ may be linked with each other to form an aromatic ring group.

Chemical Formula 3-3-A to 3-3-F

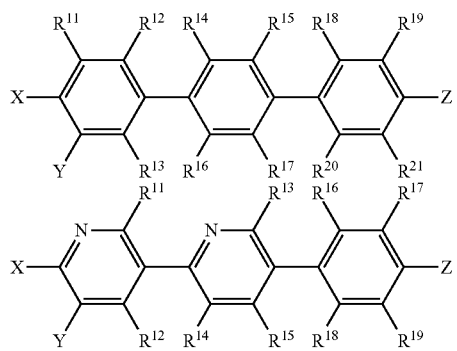

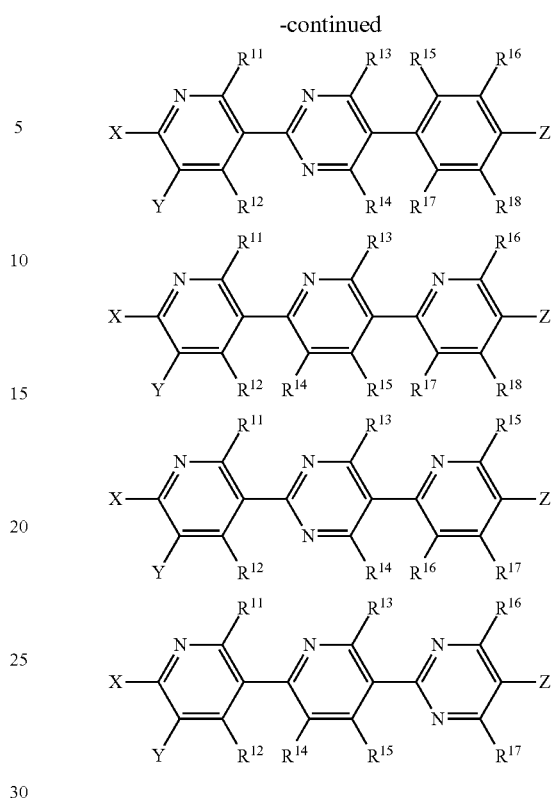

In Chemical Formula 3-3-A to 3-3-F,

X may be a first functional group bound to the surface of the semiconductor nanocrystal, Y may be a second functional group present at an ortho position with respect to the first functional group (X), Z may be a third functional group present at a para position with respect to the first functional group (X), and $R^{11}$, $R^{12}$, $R^{13}$, $R^{14}$, $R^{15}$, $R^{16}$, $R^{17}$, $R^{18}$, $R^{19}$, $R^{20}$, and $R^{21}$ may independently be hydrogen, a C1 to C10 alkyl group, a C2 to C10 alkenyl group, a C2 to C10 alkynyl group, a C6 to C18 aryl group or a C2 to C18 heteroaryl group, or optionally two adjacent substituents of $R^{11}$, $R^{12}$, $R^{13}$, $R^{14}$, $R^{15}$, $R^{16}$, $R^{17}$, $R^{18}$, $R^{19}$, $R^{20}$, and $R^{21}$ may be linked with each other to form an aromatic ring group.

Chemical Formula 3-4-A to 3-4-K

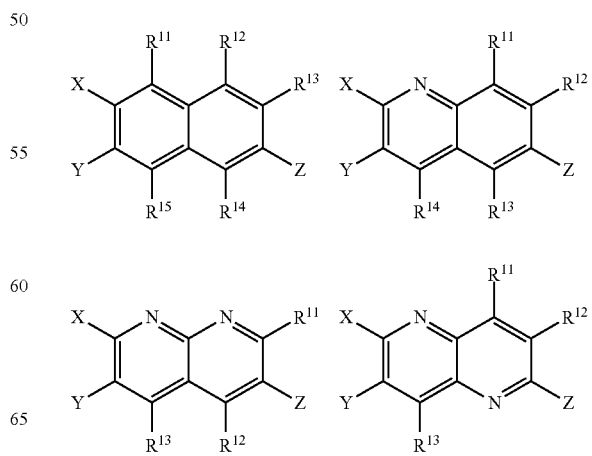

-continued

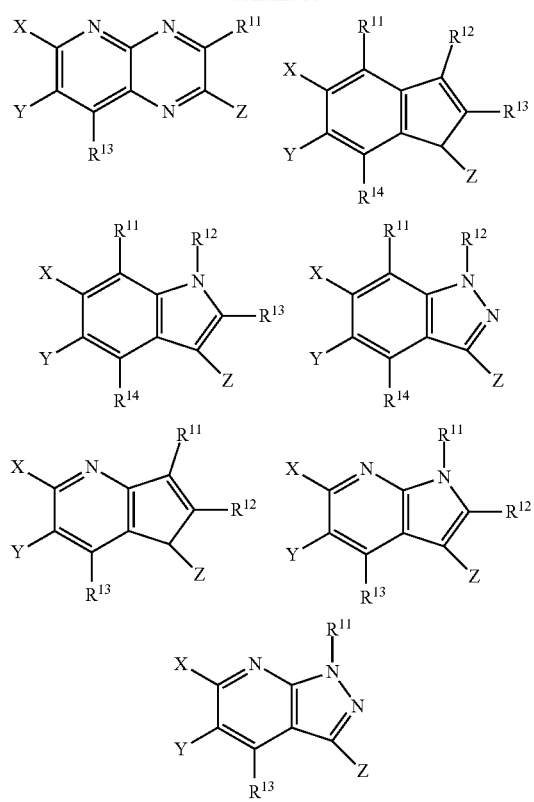

In Chemical Formula 3-4-A to 3-4-K,

X may be a first functional group bound to the surface of the semiconductor nanocrystal, Y may be a second functional group present at an ortho position with respect to the first functional group (X), Z may be a third functional group present at a para position with respect to the first functional group (X), and $R^{11}$, $R^{12}$, $R^{13}$, $R^{14}$, and $R^{15}$ may independently be hydrogen, a C1 to C10 alkyl group, a C2 to C10 alkenyl group, a C2 to C10 alkynyl group, a C6 to C18 aryl group, or a C2 to C18 heteroaryl group, or optionally two adjacent substituents of $R^{11}$, $R^{12}$, $R^{13}$, $R^{14}$, and $R^{15}$ may be linked with each other to form an aromatic ring group.

Chemical Formula 3-5-A to G

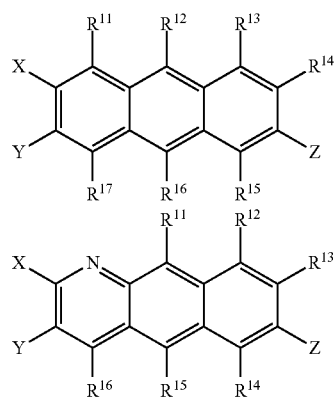

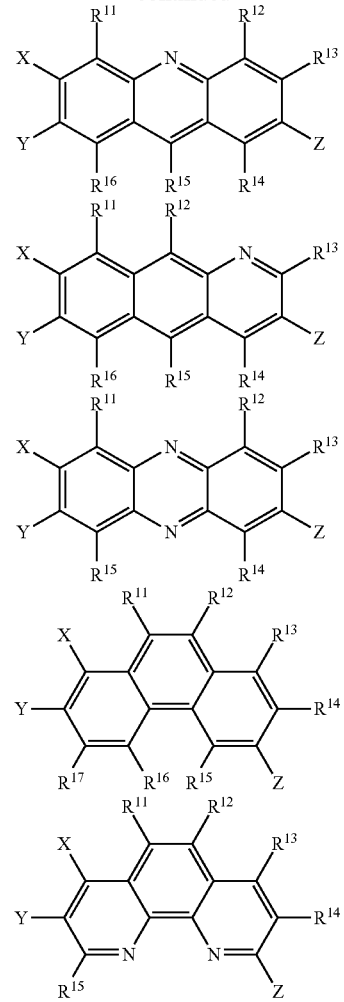

In Chemical Formula 3-5-A to 3-5-G,

X may be a first functional group bound to the surface of the semiconductor nanocrystal, Y may be a second functional group present at an ortho position with respect to the first functional group (X), Z may be a third functional group present at a para position with respect to the first functional group (X), and $R^{11}$, $R^{12}$, $R^{13}$, $R^{14}$, $R^{15}$, $R^{16}$, and $R^{17}$ may independently be hydrogen, a C1 to C10 alkyl group, a C2 to C10 alkenyl group, a C2 to C10 alkynyl group, a C6 to C18 aryl group, or a C2 to C18 heteroaryl group, and optionally two adjacent substituents of $R^{11}$, $R^{12}$, $R^{13}$, $R^{14}$, $R^{15}$, $R^{16}$, and $R^{17}$ may be linked with each other to form an aromatic ring group.

In Chemical Formula 3-1-A to 3-5-G, the first functional group (X) may be a thiol group (—SH), an amine group, an amide group, an imine group, a cyano group, an imide group, a carboxyl group (—COOH), a sulfonic acid group (—SO$_3$H), a phosphine group, a phosphite group, a phosphonic acid group or a phosphonate group (—PO(OR)$_2$, wherein R is hydrogen or a C1 to C10 alkyl group), —OP(O)Cl$_2$, —POCl$_2$, —Si(OH)$_3$, —SiCl$_3$, —Si(OR)$_3$ (wherein OR is a C1 to C10 alkoxy group), a hydroxy group (—OH), an ether group (—ROR', wherein R is a C1 to C10 alkylene group and R' is a C1 to C10 alkyl group), —C(O)R (wherein R is a halogen or a C1 to C10 alkyl group), a carbazolyl group, —SO$_2$Cl, or a nitro group (—NO$_2$).

In Chemical Formulae 3-1-A to 3-5-G, the second functional group (Y) may be a substituted or unsubstituted linear or branched C1 to C10 alkyl group, a substituted or unsubstituted linear or branched C2 to C10 alkenyl group, a substituted or unsubstituted linear or branched C2 to C10 alkynyl group, a substituted or unsubstituted C6 to C18 aryl group, or a substituted or unsubstituted C2 to C18 heteroaryl group.

In Chemical Formulae 3-1-A to 3-5-G, the third functional group may be a substituted or unsubstituted linear or branched C1 to C10 alkyl group, a substituted or unsubstituted linear or branched C2 to C10 alkenyl group, a substituted or unsubstituted linear or branched C2 to C10 alkynyl group, a substituted or unsubstituted C6 to C18 aryl group, a substituted or unsubstituted C2 to C18 heteroaryl group.

The second functional group (Y) and the third functional group (Z) may be the same or different.

In an embodiment, the organic ligand may be the following compounds.

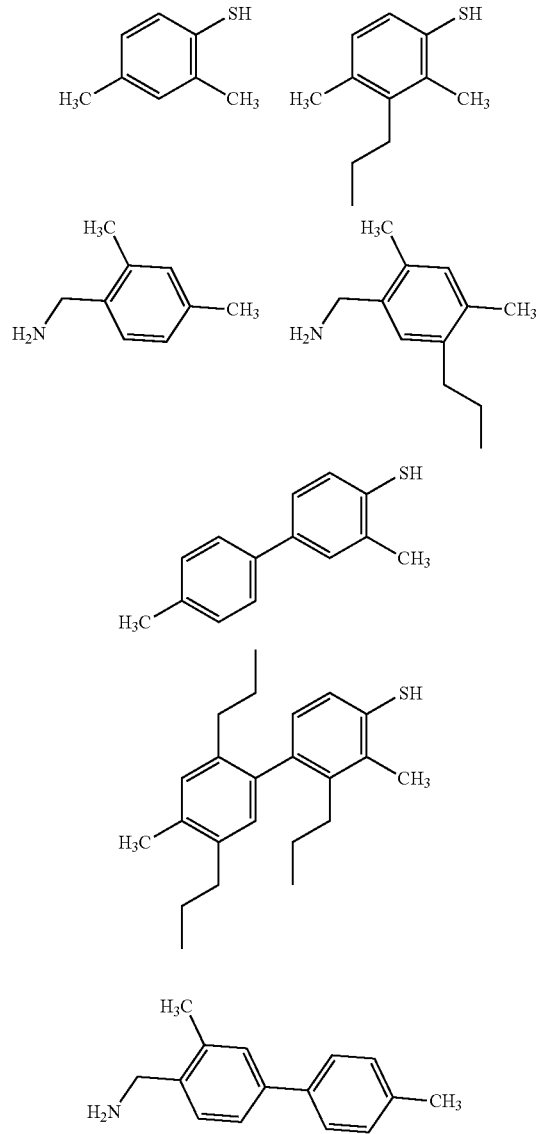

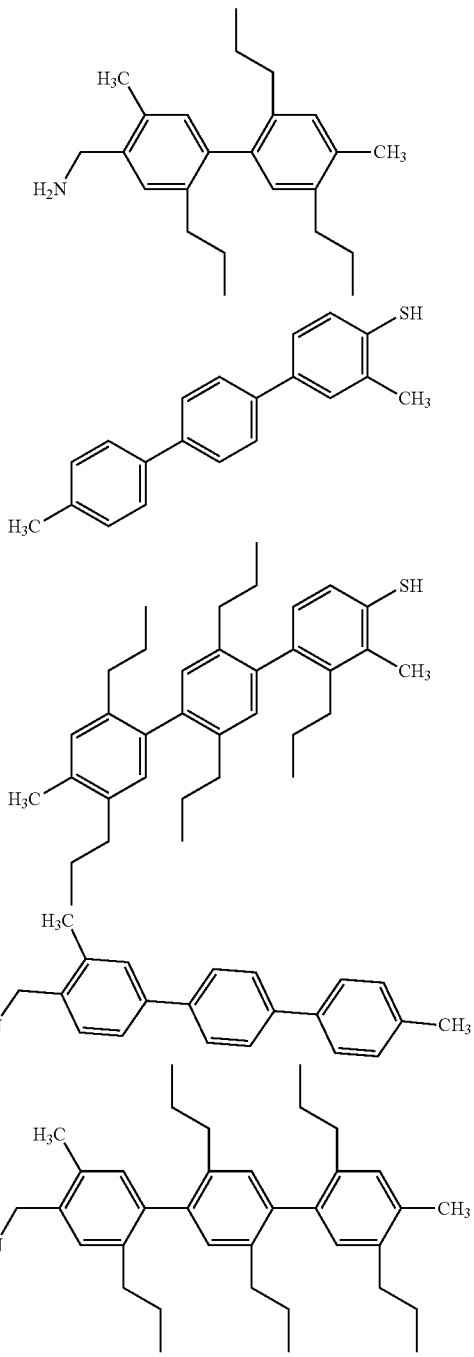

The ligand layer may further include a second organic ligand, wherein the second organic ligand is RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, or $R_2POOH$ (wherein, R and R' are each independently a substituted or unsubstituted C1 to C24 alkyl group, a substituted or unsubstituted C2 to C24 alkenyl group, or a substituted or unsubstituted C2 to C24 alkynyl group).

Specific examples of the second organic ligand may be a thiol compound such as methane thiol, ethane thiol, propane thiol, butane thiol, pentane thiol, hexane thiol, octane thiol, dodecane thiol, hexadecane thiol, octadecane thiol, benzyl thiol, and the like; amines such as methylamine, ethylamine, propylamine, butylamine, pentylamine, hexylamine, octylamine, nonylamine, decylamine, dodecyl amine, hexadecyl amine, octadecyl amine, dimethyl amine, diethyl amine, dipropyl amine, tributylamine, trioctylamine, and the like; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and the like; a phosphine compound such as methyl phosphine, ethyl phosphine, propyl phosphine, butyl phosphine, pentyl phosphine, octylphosphine, dioctyl phosphine, tributylphosphine, trioctylphosphine, diphenyl phosphine, triphenyl phosphine and the like; a phosphine oxide compound thereof such as methyl phosphine oxide, ethyl phosphine oxide, propyl phosphine oxide, butyl phosphine oxide pentyl phosphine oxide, tributylphosphine oxide, octylphosphine oxide, dioctyl phosphine oxide, trioctylphosphine oxide, diphenyl phosphine oxide, or triphenyl phosphine oxide; a C5 to C20 alkyl phosphonic acid such as hexylphosphonic acid, octylphosphonic acid, dodecylphosphonic acid, tetradecylphosphonic acid, hexadecylphosphonic acid, or octadecylphosphonic acid; or a phosphinic acid such as hexylphosphinic acid, octylphosphinic acid, dodecylphosphinic acid, tetradecylphosphinic acid, hexadecylphosphinic acid, or octadecylphosphinic acid, but are not limited thereto.

The semiconductor nanocrystal-ligand composite may further include a polyvalent metal compound.

The polyvalent metal compound may include Zn, In, Ga, Mg, Ca, Sc, Sn, Ti, V, Cr, Mn, Fe, Co, Ni, Cu, Sr, Y, Zr, Nb, Mo, Cd, Ba, Au, Hg, TI, or a combination thereof.

The polyvalent metal compound may be an organometallic compound, an organic salt, an inorganic salt, or a combination thereof. The polyvalent metal compound may include a metal halide, a metal alkyl (e.g., a metal C1 to C24 alkyl, a metal carboxylate (e.g., a C1 to C24 carboxylate) such as a metal acetate, a metal (meth)acrylate, a metal dialkyl dithiocarbamate (e.g., a (C1 to C24 alkyl)dithiocarbamate), a metal chalcogenide, or a combination thereof.

The metal halide may be a metal chloride, a metal bromide, or metal iodide. The polyvalent metal compound may be a metal chloride such as zinc chloride, indium chloride, cadmium chloride, aluminum chloride, iron chloride, or manganese chloride; a metal alkyl such as diethyl zinc, dipropyl zinc, dibutyl zinc, triethylaluminum, or tributylaluminum; an organometallic compound such as a zinc carboxylate, for example a zinc acetate, a zinc acrylate, a zinc diethyl dithiocarbamate, or an indium acetate, or a combination thereof.

The polyvalent metal compound may be included in an amount of greater than or equal to about 0.1 parts by weight, for example greater than or equal to about 0.5 parts by weight, greater than or equal to about 1.0 parts by weight, or greater than or equal to about 2.0 parts by weight and less than or equal to about 30 parts by weight, for example less than or equal to about 25 parts by weight, less than or equal to about 20 parts by weight, or less than or equal to about 15 parts by weight based on 100 parts by weight of the ligand of the semiconductor nanocrystal-ligand composite. The luminous efficiency characteristic may be improved in the ranges.

In the semiconductor nanocrystal-ligand composite, the semiconductor nanocrystal may be a Group II-VI compound, a Group III-V compound, a Group IV-VI compound, a Group IV element or compound, a Group I-III-VI compound, a Group I-II-IV-VI compound, or a combination thereof. The semiconductor nanocrystal may not include cadmium, lead, or a combination thereof.

The Group II-VI compound may be a binary element compound such as CdSe, CdTe, ZnS, ZnSe, ZnTe, ZnO, HgS, HgSe, HgTe, MgSe, MgS, or a mixture thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a mixture thereof; or a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof. The Group II-VI compound may further include a Group III metal.

The Group III-V compound may be a binary element compound such as GaN, GaP, GaAs, GaSb, AlN, AlP, AlAs, AlSb, InN, InP, InAs, InSb, or a mixture thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a mixture thereof; or a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, or a mixture thereof. The Group III-V compound may further include a Group II metal (e.g., InZnP).

The Group IV-VI compound may be a binary element compound such as SnS, SnSe, SnTe, PbS, PbSe, PbTe, or a mixture thereof; a ternary element compound such as SnSeS, SnSeTe, SnSTe, PbSeS, PbSeTe, PbSTe, SnPbS, SnPbSe, SnPbTe, or a mixture thereof; a quaternary element compound such as SnPbSSe, SnPbSeTe, SnPbSTe, or a mixture thereof.

Examples of a Group I-III-VI compound may include $CuInSe_2$, $CuInS_2$, CuInGaSe, and CuInGaS, but are not limited thereto. Examples of a Group I-II-IV-VI compound may include CuZnSnSe and CuZnSnS, but are not limited thereto.

The Group IV element or compound may be a singular element material such as Si, Ge, or a mixture thereof; or a binary element compound such as SiC, SiGe, or a mixture thereof.

The binary element compound, the ternary element compound, or the quaternary element compound may be respectively included in the particle at a uniform concentration or at partially different concentrations.

The semiconductor nanocrystal may have a core/shell structure wherein a second semiconductor nanocrystal having a different composition from a first semiconductor nanocrystal is disposed on a core including the first semiconductor nanocrystal. An alloy interlayer may exist or may not exist on the interface between the core and the shell. When the alloy interlayer is present, the interface between the core and the shell may have a concentration gradient wherein a concentration of an element of the shell is changed in a radial direction (e.g., increased or decreased toward the core). The shell may include a multi-layered shell having at least two layers. In the multi-layered shell, each layer may have a single composition or a composition having an alloy or a concentration gradient, but is not limited thereto.

In the core-shell semiconductor nanocrystal, the shell may have a larger energy bandgap than the core or vice versa. In the multi-layered shell, an outer shell of a core may have a greater energy bandgap than a shell near to a core, but is not limited thereto.

The semiconductor nanocrystal may have a size (an equivalent particle diameter or in the case of non-spherically shaped particle, a particle diameter calculated from a two-dimensional area confirmed by an electron microscopy analysis) of about 1 nm to about 100 nm. In an embodiment, the semiconductor nanocrystal may have a particle diameter (the longest dimension for a non-spherically shaped particle) of about 1 nm to about 20 nm, for example about 2 nm to about 15 nm, or about 3 nm to about 15 nm. In an embodiment, the semiconductor nanocrystal may have a particle diameter of greater than or equal to about 2 nm, greater than or equal to about 3 nm, greater than or equal to about 4 nm, or greater than or equal to about 5 nm. The semiconductor nanocrystal may have a particle diameter of less than or equal to about 50 nm, less than or equal to about 45 nm, less than or equal to about 40 nm, less than or equal to about 35 nm, less than or equal to about 30 nm, less than or equal to about 25 nm, less than or equal to about 20 nm, less than or equal to about 15 nm, less than or equal to about 10 nm, less than or equal to about 9 nm, less than or equal to about 8 nm, or less than or equal to about 7 nm.

In addition, a shape of the semiconductor nanocrystal may be a general shape in the art but is not particularly limited. For example, the semiconductor nanocrystal may have a spherical, oval, pyramidal, multi-armed, or cubic nanoparticle, nanotube, nanowire, nanofiber, nanosheet, or a combination thereof.

In addition, the semiconductor nanocrystal may be commercially available or may be synthesized by any method. For example, several nano-sized semiconductor nanocrystals may be synthesized by a wet chemical process and may be provided in a form of a semiconductor nanocrystal dispersion. In the wet chemical process, precursor materials react in an organic solvent to grow crystal particles and the organic solvent or a ligand compound may naturally coordinate on the surface of the semiconductor nanocrystal, controlling the growth of the crystal. Examples of the organic solvent and the ligand compound are known. The organic solvent coordinated on the surface of the semiconductor nanocrystal may affect stability of a device, and thus excess organic materials that are not coordinated on the surface of the semiconductor nanocrystals may be removed by soaking the semiconductor nanocrystals in an excess of solvent in which the semiconductor nanocrystals are insoluble and the organic materials are soluble, and centrifuging the resulting mixture. Examples of the solvent may be acetone, ethanol, methanol, and the like, but are not limited thereto.

The semiconductor nanocrystal-ligand composite may be prepared through a ligand substitution reaction by adding the organic ligand compound including the first functional group (X), the second functional group (Y), and optionally, the third functional group (Z) along with the moiety having a conjugation structure to the synthesized semiconductor nanocrystal dispersion. Through this ligand substitution process, the organic ligand compound may be coordinated on the surface of the semiconductor nanocrystals. The ligand substitution process may be performed at about 50° C. to about 90° C., for example, about 60° C. to about 80° C. After the ligand substitution process, the semiconductor nanocrystal-ligand composite is added to an organic solvent such as alcohol and the like and then, centrifuged to isolate the semiconductor nanocrystal-ligand composites.

According to another embodiment, an electronic device includes the semiconductor nanocrystal-ligand composite. The electronic device may include a light emitting device such as an organic light emitting diode (OLED), a quantum dot LED (QD LED), and the like, a sensor, an image sensor, a solar cell, or a display device such as a liquid crystal display (LCD) device, and the like, but is not limited thereto.

In an embodiment, the electronic device may be a photoluminescent device (e.g., a lighting such as a quantum dot sheet or a quantum dot rail or a liquid crystal display (LCD)) or an electroluminescent device (e.g., QD LED). In a non-limiting embodiment, the electronic device may include a quantum dot sheet and the semiconductor nanocrystal-ligand composite may be included in the quantum dot sheet.

In a non-limiting embodiment, the electronic device may be a light emitting device.

Hereinafter, referring to FIG. 1, a light emitting device according to an embodiment is described. FIG. 1 is a schematic cross-sectional view of a light emitting device according to an embodiment. Referring to FIG. 1, a light emitting device 10 includes an anode 11 and a cathode 15 facing each other and an emission layer 13 disposed between the anode 11 and the cathode 15 and the emission layer 13 may include the aforementioned semiconductor nanocrystal-ligand composite.

The anode 11 may include a hole injection conductor having a relatively high work function. The cathode 15 may include an electron injection conductor having a low work function. The electron/hole injection conductor may include a metal-based material such as aluminum, magnesium, tungsten, nickel, cobalt, platinum, palladium, calcium, LiF, and the like (e.g., a metal, a metal compound, an alloy, or a combination thereof), a metal oxide such as gallium indium oxide or indium tin oxide, or a conductive polymer having a relatively high work function such as polyethylene dioxythiophene, but is not limited thereto.

The anode 11, the cathode 15, or a combination thereof may be a light transmitting electrode or a transparent electrode. In an embodiment, both of the anode 11 and the cathode 15 may be light transmitting electrodes. The electrode may be patterned.

The light transmitting electrode may be made of, for example a transparent conductor such as indium tin oxide (ITO) or indium zinc oxide (IZO), gallium indium tin oxide, zinc indium tin oxide, titanium nitride, polyaniline, or LiF/Mg:Ag, or a metal thin film of a thin monolayer or multilayer but is not limited thereto. When one of the anode 11 and the cathode 15 is a non-light transmitting electrode, it may be made of, for example, an opaque conductor such as aluminum (Al), a lithium aluminum (Li:Al) alloy, a magnesium-silver alloy (Mg:Ag), or a lithium fluoride-aluminum (LiF:Al).

The light transmitting electrode may be disposed on a transparent substrate (e.g., insulating transparent substrate). The substrate may be rigid or flexible. The substrate may be a plastic, glass, or a metal.

Thicknesses of the anode 11 and the cathode 15 are not particularly limited and may be selected considering device efficiency. For example, the thicknesses of the anode 11 and the cathode 15 may be respectively greater than or equal to about 5 nm, for example, greater than or equal to about 50 nm and less than or equal to about 100 µm, for example, less than or equal to about 10 µm, or less than or equal to about 1 µm, less than or equal to about 900 nm, less than or equal to about 500 nm or less than or equal to about 100 nm, but are not limited thereto.

The emission layer 13 includes a plurality of semiconductor nanocrystal-ligand composites. The emission layer 13 may include a monolayer of the plurality of semiconductor nanocrystal-ligand composites.

Figure 2:
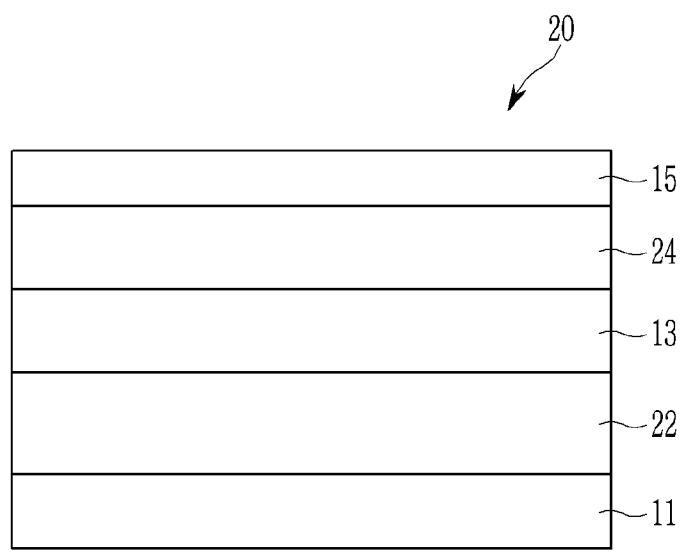
FIG. 2 is a schematic cross-sectional view showing a light emitting device according to another embodiment.

Referring to FIG. 2, a light emitting device according to another embodiment is described. FIG. 2 is a schematic cross-sectional view of a light emitting device according to another embodiment. The light emitting device 20 may include a charge (hole or electron) auxiliary layer between the anode 11 and the cathode 15. For example, the light emitting device may include a hole auxiliary layer 22 between the anode 11 and the emission layer 13 and/or an electron auxiliary layer 24 between the cathode 15 and the emission layer 13.

The hole auxiliary layer 22 may include for example a hole injection layer (HIL) to facilitate hole injection, a hole transport layer (HTL) to facilitate hole transport, an electron blocking layer (EBL) to inhibit electron transport, or a combination thereof. For example, the hole injection layer may be disposed between the hole transport layer and the anode. For example, the electron blocking layer may be disposed between the emission layer and the hole transport (injection) layer but is not limited thereto. A thickness of each layer may be desirably selected. For example, each thickness of the layer may be greater than or equal to about 1 nm and less than or equal to about 500 nm but is not limited thereto. The hole injection layer may be an organic layer that is formed by a solution process (e.g., spin coating etc.) using for example PEDOT:PSS. The hole transport layer may be an organic layer that is formed by a solution process (e.g., spin coating etc.).

The electron auxiliary layer may include for example an electron injection layer (EIL) to facilitate electron injection, an electron transport layer (ETL) to facilitate electron transport, a hole blocking layer (HBL) to inhibit hole transport, or a combination thereof. For example, the electron injection layer may be disposed between the electron transport layer and the cathode. For example, the hole-blocking layer may be disposed between the emission layer and the electron transport (injection) layer but is not limited thereto. A thickness of each layer may be desirably selected. For example, each thickness of the layer may be greater than or equal to about 1 nm and less than or equal to about 500 nm but is not limited thereto. The electron injection layer may be an organic layer formed by deposition. The electron transport layer may include an inorganic oxide nanoparticle or may be an organic layer formed by deposition.

The emission layer may be disposed between the hole injection (or transport) layer and an electron injection (or transport) layer. The emission layer may be disposed as a separate layer between the hole auxiliary layer and the electron auxiliary layer.

The charge auxiliary layer may include for example an organic material, an inorganic material, or an organic/inorganic material. The organic material may be a compound having hole or electron-related properties. The inorganic material may be for example a metal oxide such as molybdenum oxide, tungsten oxide, zinc oxide, or nickel oxide, but is not limited thereto.

In an embodiment, the hole transport layer (HTL) may include, for example poly(3,4-ethylenedioxythiophene): poly(styrenesulfonate) (PEDOT:PSS), poly(9,9-dioctyl-fluorene-co-N-(4-butylphenyl)-diphenylamine) (TFB), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[4-(N,N-di-(p-tolyl)amino) phenyl]cyclohexane (TAPC), a p-type metal oxide (e.g., NiO, WO$_3$, MoO$_3$, etc.), a carbon-based material such as graphene oxide, or a combination thereof, but is not limited thereto.

In an embodiment, the electron blocking layer (EBL) may include for example poly(3,4-ethylenedioxythiophene):poly(styrene sulfonate) (PEDOT:PSS), poly(9,9-dioctyl-fluorene-co-N-(4-butylphenyl)-diphenylamine) (TFB), polyarylamine, poly(N-vinylcarbazole), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

In an embodiment, the electron transport layer (ETL) may include for example 1,4,5,8-naphthalene-tetracarboxylic dianhydride (NTCDA), bathocuproine (BCP), tris[3-(3-pyridyl)-mesityl]borane (3TPYMB), LiF, Alq$_3$, Gaq$_3$, Inq$_3$, Znq$_2$, Zn(BTZ)$_2$, BeBq$_2$, ET204 (8-(4-(4,6-di(naphthalen-2-yl)-1,3,5-triazin-2-yl)phenyl)quinolone), 8-hydroxyquinolinato lithium (Liq), an n-type metal oxide (e.g., ZnO, HfO$_2$, etc.), or a combination thereof, but is not limited thereto.

In an embodiment, the hole blocking layer (HBL) may include for example 1,4,5,8-naphthalene-tetracarboxylic dianhydride (NTCDA), bathocuproine (BCP), tris[3-(3-pyridyl)-mesityl] borane (3TPYMB), LiF, Alq$_3$, Gaq$_3$, Inq$_3$, Znq$_2$, Zn(BTZ)$_2$, BeBq$_2$, or a combination thereof, but is not limited thereto.

In the light emitting device, the anode 11 may be disposed on a transparent substrate. Herein, the light emitting device may include the anode 11 disposed on the transparent substrate; the cathode 15 facing the anode 11; the hole auxiliary layer 22 disposed between the anode 11 and the emission layer 13; and the electron auxiliary layer 24 disposed between the emission layer 13 and the cathode 15.

In another embodiment, the light emitting device may have an inverted structure. Herein, the cathode disposed on a transparent substrate may include a metal oxide-based transparent electrode (e.g., ITO) and the anode facing the cathode may include a metal (e.g., Au, Ag, etc.) of a relatively high work function. For example, an n-type metal oxide (ZnO) may be disposed between the transparent electrode and the emission layer as an electron auxiliary layer (e.g., an electron transport layer (ETL)). MoO$_3$ or another p-type metal oxide as a hole auxiliary layer (e.g., hole transport layer (HTL)) may be disposed between the metal anode and the emission layer.

Hereinafter, specific examples are illustrated. However, these examples are exemplary, and the present disclosure is not limited thereto.

Comparative Example 1

Comparative Example 1-1: Preparation of ZnTeSe Core

Selenium and tellurium are respectively dispersed in trioctylphosphine (TOP) to obtain a 2 M Se/TOP solution and a 0.1 M Te/TOP solution. A 1 M diethylzinc hexane solution is prepared. The Se/TOP solution, the Te/TOP solution, and the diethylzinc hexane solution are mixed to prepare a precursor mixed solution. In the precursor mixed solution, each amount of Se and Te per 1 mol of zinc is 0.8 mol and 0.03 mol, respectively.

Trioctylamine is placed in a 300 mL reaction flask, oleic acid (OA) and hexadecylamine (HDA) are respectively added thereto in an amount of 2.5 mol per 1 mol of a zinc precursor (diethylzinc) in the flask. After purging the flask with nitrogen (N$_2$), the flask is heated at 280° C. for 10 minutes to obtain a heated organic ligand solution.

The above precursor mixed solution is added to the heated organic ligand solution, and the obtained mixture is heated up to 300° C. and reacted at the same temperature for 40 minutes. After the reaction, the resultant reaction mixture is rapidly cooled down to room temperature (24° C.), ethanol is added thereto, and the mixture is centrifuged to recover ZnSeTe core particles. The recovered ZnSeTe core particles are dispersed in toluene.

Comparative Example 1-2: Formation of ZnSeS/ZnS Shell

Trioctylamine is placed in a 300 mL flask. 0.6 mmol of zinc acetate and oleic acid are added thereto and then, vacuum-treated at 120° C. for 10 minutes. Herein, an amount of the oleic acid is twice as much as that of the zinc acetate. After purging the flask with nitrogen ($N_2$), the flask is heated up to 180° C. Subsequently, the ZnTeSe core particles according to Comparative Example 1-1 are rapidly added thereto (reaction time: 40 minutes), and the obtained mixture is heated up to 320° C., while Se/TOP and S/TOP are added thereto. During the reaction, Se/TOP and S/TOP are respectively injected portion wise thereinto every 20 minutes, wherein in the first injection step, Se/TOP is injected in a larger amount than that of S/TOP, and in the final injection step, only S/TOP is injected. A total addition amount of Se is 0.4 mmol, and a total addition amount of S is 0.8 mmol.

When the reaction is complete, the resultant is cooled down to room temperature (24° C.), ethanol is added thereto, the obtained mixture is centrifuged to obtain core/shell semiconductor nanocrystal-ligand (oleic acid) composites, and the core/shell semiconductor nanocrystal-ligand (oleic acid) composites are added to cyclohexane to obtain a semiconductor nanocrystal-ligand (oleic acid) composite dispersion. This process is six times repeated to prepare six samples.

Comparative Example 2

The semiconductor nanocrystal-ligand (oleic acid) composite dispersion according to Comparative Example 1 is put in a flask charged with nitrogen, and 3 parts by weight of 4-BPT (4-biphenyl thiol) based on 100 parts by weight of the semiconductor nanocrystals are added thereto and then, stirred at 60° C. for 30 minutes. After the reaction, the resultant reaction mixture is cooled down to room temperature (24° C.), an excess amount of ethanol is added thereto and then, precipitated in a centrifuge method (5000 rpm, 5 minutes), and after discarding a supernatant, semiconductor nanocrystals obtained therefrom are dispersed in cyclohexane. The precipitation/the centrifugation are repetitively performed to prepare a final dispersion of semiconductor nanocrystal substituted with a 4-BPT organic ligand. This process is six times repeated to prepare six samples.

Comparative Example 3

The semiconductor nanocrystal-ligand (oleic acid) composite dispersion according to Comparative Example 1 is put in a flask charged with nitrogen, and 3 parts by weight of DDT (1-dodecanethiol) based on 100 parts by weight of the semiconductor nanocrystals are added thereto and then, stirred at 60° C. for 30 minutes. After the reaction, the resultant is cooled down to room temperature (24° C.), an excessive amount of ethanol is added thereto, the obtained mixture is precipitated in a centrifuge method (5000 rpm, 5 minutes), and after discarding the supernatant semiconductor nanocrystals obtained therefrom are dispersed in cyclohexane. The precipitation/the centrifugation are repetitively performed to obtain a final dispersion of semiconductor nanocrystal substituted with a DDT organic ligand. This process is six times repeated to prepare six samples.

Example 1

The semiconductor nanocrystal-ligand (oleic acid) composite dispersion according to Comparative Example 1 is put in a flask charged with nitrogen, 3 parts by weight of DMBT (2,4-dimethylbenzene thiol) based on 100 parts by weight of the semiconductor nanocrystals are added thereto and then, stirred at 60° C. for 30 minutes. After the reaction, the resultant reaction mixture is cooled down to room temperature (24° C.), an excessive amount of ethanol is added thereto and precipitated in a centrifuge method (5000 rpm, 5 minutes), and after discarding the supernatant, semiconductor nanocrystals obtained therefrom are dispersed in cyclohexane. The precipitation/the centrifugation are repetitively performed to prepare a final dispersion of semiconductor nanocrystal substituted with a DMBT organic ligand. This process is 6 times repeated to prepare six samples.

Storage Stability and Photoluminescent Characteristics

Four samples out of the six samples show a precipitation reaction in the substitution process of an organic ligand during preparation of the dispersion of the semiconductor nanocrystal-ligand composite according to Comparative Example 2. Photoluminescent characteristics illustrated later are measured by using two samples not showing the precipitation reaction. On the contrary, all the six samples show no precipitation reaction during preparation of the dispersion of the semiconductor nanocrystal-ligand composite according to Example 1.

Photoluminescent characteristics of the semiconductor nanocrystal-ligand composites according to Comparative Examples 1, 2, and 3 and Example 1 are analyzed, and the results of Comparative Example 1 and Example 1 are shown in Table 1. The photoluminescent characteristics are analyzed by obtaining a photoluminescence (PL) spectrum of the manufactured nanocrystals at a radiation wavelength of 372 nm with a HITACHI F-7000 spectrometer.

TABLE 1

|  | Initial | | | After 13 days | | |
| --- | --- | --- | --- | --- | --- | --- |
|  | PL wavelength (nm) | Full width at half maximum (FWHM) (nm) | QY (%) | PL wavelength (nm) | Full width at half maximum (FWHM) (nm) | QY (%) |
| Comparative Example 1 | 452 | 26 | 84 | 452 | 26 | 64 |
| Example 1 | 452 | 26 | 84 | 452 | 26 | 84 |

Referring to Table 1, the semiconductor nanocrystal-ligand composite of Example 1 exhibits improved luminous efficiency (quantum yield (QY)) when stored for a long term as well as maintains a PL wavelength or a full width at half maximum (FWHM) compared with the semiconductor nanocrystal-ligand composite of Comparative Example 1.

Comparative Example 4: Manufacture of Light Emitting Device

ITO is deposited on a glass substrate to form an anode, PEDOT:PSS and TFB (poly(9,9-dioctyl-fluorene-co-N-(4- butylphenyl)-diphenylamine)) are spin-coated thereon to form a hole transport layer (HTL). On the hole transport layer (HTL), a dispersion of the semiconductor nanocrystal-ligand composite according to Comparative Example 1 is spin-coated to form an emission layer. On the emission layer, ET204 (8-(4-(4,6-di(naphthalen-2-yl)-1,3,5-triazin-2-yl)phenyl)quinolone) and Liq (8-hydroxyquinolinato lithium) are vacuum-deposited to form an electron transport layer (ETL). On the electron transport layer (ETL), Al is deposited to form a cathode and thus manufacture a light emitting device.

Comparative Example 5: Manufacture of Light Emitting Device

A light emitting device is manufactured according to the same method as Comparative Example 4 except that the semiconductor nanocrystal-ligand composite of Comparative Example 2 is used instead of the semiconductor nanocrystal-ligand composite of Comparative Example 1.

Comparative Example 6: Manufacture of Light Emitting Device

A light emitting device is manufactured according to the same method as Comparative Example 4 except that the semiconductor nanocrystal-ligand composite of Comparative Example 3 is used instead of the semiconductor nanocrystal-ligand composite of Comparative Example 1.

Example 2: Manufacture of Light Emitting Device

A light emitting device is manufactured according to the same method as Comparative Example 4 except that the semiconductor nanocrystal-ligand composite of Example 1 is used instead of the semiconductor nanocrystal-ligand composite of Comparative Example 1.

Characteristics Evaluation of Light Emitting Device

External quantum efficiency and current efficiency of the light emitting devices according to Comparative Examples 4 and 5 and Example 2 are measured, while a voltage (0 V to 7 V) is applied between an ITO electrode and an Al electrode, and the results are shown in Table 2.

TABLE 2

|  | $EQE_{max}$ (%) | Current efficiency (Cd/A) |
| --- | --- | --- |
| Comparative Example 4 | 3.685 | 3.345 |
| Comparative Example 5 | 6.399 | 4.892 |
| Example 2 | 8.374 | 6.059 |

Figure 3:
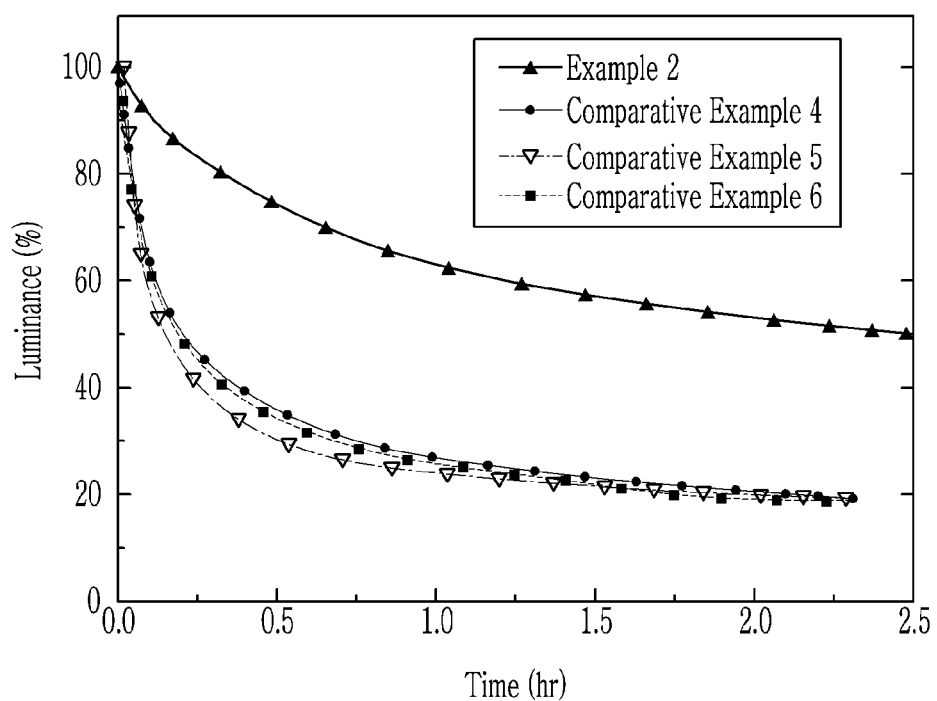
FIG. 3 is a graph showing the luminance (%) depending on a driving time (hours) of the light emitting devices according to Comparative Example 4, Comparative Example 5, Comparative Example 6, and Example 2.

Referring to Table 2, the light emitting device of Example 2 including the semiconductor nanocrystal-ligand composite of Example 1 shows improved external quantum efficiency and current efficiency compared with the light emitting devices of Comparative Examples 4 and 5 respectively including the semiconductor nanocrystal-ligand composites of Comparative Examples 1 and 2. Each luminance of the light emitting devices of Comparative Examples 4, 5, and 6 and Example 2 depending on a driving time is measured, and the results are shown in FIG. 3. FIG. 3 is a graph showing each luminance depending on a driving time of the light emitting devices of Comparative Examples 4, 5, and 6 and Example 2. Referring to FIG. 3, as for the light emitting device of Example 2 including the semiconductor nanocrystal-ligand composite of Example 1, it takes 2.5 hours or longer for luminance to decrease by 50% relative to the initial luminance, and as for the light emitting devices of Comparative Examples 4 to 6 including the semiconductor nanocrystal-ligand composites of Comparative Examples 1 to 3, it takes about 0.2 hours or less for luminance to decrease by 50% relative to the initial luminance. Accordingly, the light emitting device of Example 2 exhibits improved life-span characteristics compared with the light emitting devices of Comparative Examples 4 to 6.

Figure 4:
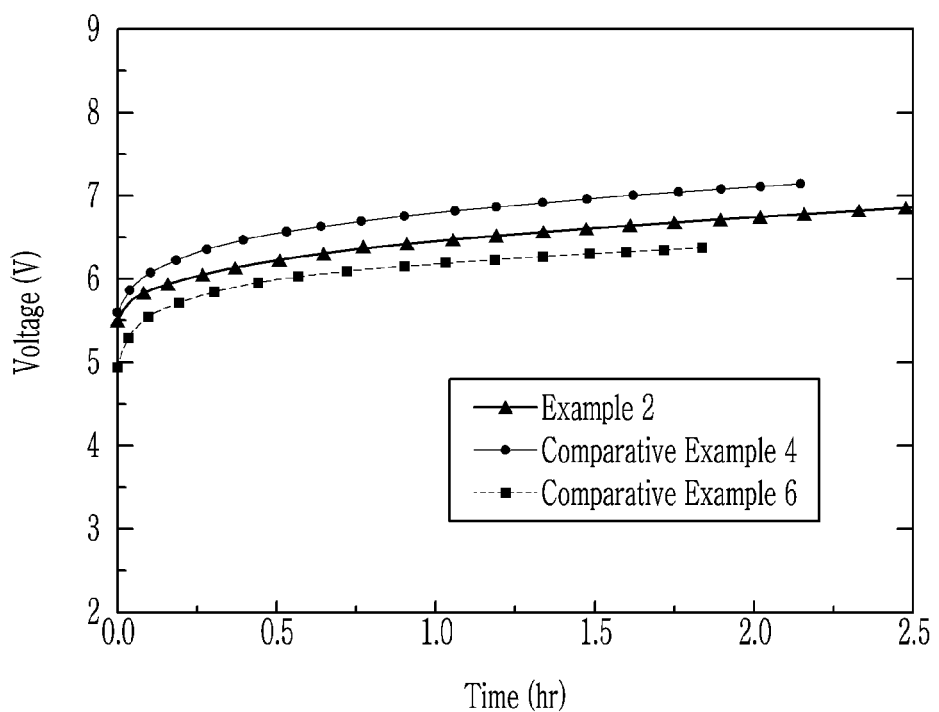
FIG. 4 is a graph showing voltage (V) depending on a driving time (hours) of the light emitting devices according to Comparative Examples 4 and 6 and Example 2.

Each voltage of the light emitting devices of Comparative Examples 4 and 6 and Example 2 depending on a driving time is measured and respectively shown in FIG. 4. FIG. 4 is a graph showing voltages depending on a driving time of the light emitting devices of Comparative Examples 4 and 6 and Example 2. Referring to FIG. 4, the light emitting device of Example 2 including the semiconductor nanocrystal-ligand composite (including an organic ligand having a conjugation structure) of Example 1 shows a small voltage change ($\Delta V$) compared with the light emitting devices of Comparative Examples 4 and 6 respectively including the semiconductor nanocrystal-ligand composites of Comparative Examples 1 and 3. Accordingly, the light emitting device of Example 2 shows high voltage stability compared with the light emitting devices of Comparative Examples 4 and 6.

While this disclosure has been described in connection with what is presently considered practical example embodiments, it is to be understood that the invention is not limited to the disclosed embodiments. On the contrary, it is intended to cover various modifications and equivalent arrangements included within the spirit and scope of the appended claims.

What is claimed is:

1. A semiconductor nanocrystal-ligand composite, comprising
a semiconductor nanocrystal and a ligand layer comprising an organic ligand coordinated on a surface of the semiconductor nanocrystal,
wherein the organic ligand comprises a moiety having a conjugation structure and a first functional group (X), a second functional group (Y), and optionally, a third functional group (Z) at a para position with respect to the first functional group linked to the moiety having a conjugation structure, wherein the organic ligand is a monomer or an oligomer,
wherein the first functional group (X) is bound to the surface of the semiconductor nanocrystal and the second functional group (Y) is present at an ortho position with respect to the first functional group (X), and when the moiety having a conjugation structure comprises an aromatic ring group, wherein the aromatic ring group is a substituted or unsubstituted monocyclic aromatic ring group, then i) the third functional group (Z) is present at the para position with respect to the first functional group, and ii) the second functional group comprises a substituted or unsubstituted linear or branched C1 to C10 alkyl group, a substituted or unsubstituted linear or branched C2 to C10 alkenyl group, a substituted or unsubstituted linear or branched C2 to C10 alkynyl group, a substituted or unsubstituted C6 to C18 aryl group, or a substituted or unsubstituted C2 to C18 heteroaryl group, provided that when the monocyclic aromatic ring group of the monomer is pyrazole, imidazole, thiazole, triazole, pyridine, pyridazine, pyrimidine, or pyrazine, then the second functional group comprises a substituted or unsubstituted linear or branched C2 to C10 alkenyl group, a substituted or unsubstituted linear or branched C2 to C10 alkynyl group, a substituted or unsubstituted C6 to C18 aryl group, or a substituted or unsubstituted C2 to C18 heteroaryl group.

2. The semiconductor nanocrystal-ligand composite of claim 1, wherein the moiety having the conjugation structure comprises an aromatic ring group, wherein the aromatic ring group is a substituted or unsubstituted monocyclic aromatic ring group; a substituted or unsubstituted condensed polycyclic aromatic ring group; at least two substituted or unsubstituted monocyclic aromatic ring groups connected to each other by a linker; or at least two substituted or unsubstituted condensed polycyclic aromatic ring groups connected to each other by a linker.

3. The semiconductor nanocrystal-ligand composite of claim 1, wherein the moiety having the conjugation structure comprises an aromatic ring group, wherein the aromatic ring group is a substituted or unsubstituted C6 to C20 aryl group; a substituted or unsubstituted C2 to C20 heteroaryl group; or a substituted or unsubstituted C6 to C20 aryl group and a substituted or unsubstituted C2 to C20 heteroaryl group connected to each other by a linker.

4. The semiconductor nanocrystal-ligand composite of claim 1, wherein the moiety having the conjugation structure comprises an aromatic ring group, wherein the aromatic ring group is benzene, naphthalene, anthracene, phenanthrene, pyrene, perylene, fluorene, pentalene, pyrazole, imidazole, thiazole, triazole, carbazole, pyridine, pyridazine, pyrimidine, pyrazine, triazine, indazole, indolizine, benzimidazole, benzothiazole, benzothiophene, benzopyrene, isoquinoline, purine, or a combination thereof connected to each other by a linker.

5. The semiconductor nanocrystal-ligand composite of claim 1, wherein the first functional group comprises a thiol group (—SH), an amine group, an amide group, an imine group, an imide group, a cyano group, a carboxyl group (—COOH), a sulfonic acid group (—SO$_3$H), a phosphine group, a phosphite group, a phosphonic acid group or a phosphonate group (—PO(OR)$_2$, wherein R is hydrogen or a C1 to C10 alkyl group), —OP(O)Cl$_2$, —POCl$_2$, —Si(OH)$_3$, —SiCl$_3$, —Si(OR)$_3$ (wherein OR is a C1 to C10 alkoxy group), a hydroxy group (—OH), an ether group (—ROR', wherein R is a C1 to C10 alkylene group and R' is a C1 to C10 alkyl group), —C(O)R (wherein R is a halogen or a C1 to C10 alkyl group), a carbazolyl group, —SO$_2$Cl, or a nitro group (—NO$_2$).

6. The semiconductor nanocrystal-ligand composite of claim 1, wherein the second functional group comprises a substituted or unsubstituted linear or branched C1 to C10 alkyl group, a substituted or unsubstituted linear or branched C2 to C10 alkenyl group, a substituted or unsubstituted linear or branched C2 to C10 alkynyl group, a substituted or unsubstituted C6 to C18 aryl group, or a substituted or unsubstituted C2 to C18 heteroaryl group.

7. The semiconductor nanocrystal-ligand composite of claim 1, wherein the organic ligand further comprises a third functional group (Z) present at a para position with respect to the first functional group.

8. The semiconductor nanocrystal-ligand composite of claim 7, wherein the third functional group comprises a substituted or unsubstituted linear or branched C1 to C10 alkyl group, a substituted or unsubstituted linear or branched C2 to C10 alkenyl group, a substituted or unsubstituted linear or branched C2 to C10 alkynyl group, a substituted or unsubstituted C6 to C18 aryl group, or a substituted or unsubstituted C2 to C18 heteroaryl group.

9. The semiconductor nanocrystal-ligand composite of claim 1, wherein the organic ligand is a compound represented by Chemical Formula 1-2:

Chemical Formula 1-2

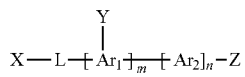

wherein in Chemical Formula 1-2,

Ar$_1$ and Ar$_2$ are independently a substituted or unsubstituted monocyclic aromatic ring group; a substituted or unsubstituted condensed polycyclic aromatic ring group; at least two substituted or unsubstituted monocyclic aromatic ring groups connected to each other by a linker; or at least two substituted or unsubstituted condensed polycyclic aromatic ring groups connected to each other by a linker, L is a single bond, a substituted or unsubstituted C1 to C30 alkylene group; or a substituted or unsubstituted C1 to C30 alkylene group comprising as a linker —O—, —NR$^a$—, —C(=O)—, —OC(=O)—, —S(=O)$_2$—, —Si(R$^b$R$^c$)$_2$—, —C(=O)NR$^d$—, or a combination thereof (wherein, R$^a$, R$^b$, R$^c$, and R$^d$ are independently hydrogen, a C1 to C10 alkyl group, a C2 to C10 alkenyl group, a C2 to C10 alkynyl group, a C6 to C18 aryl group, or a C2 to C18 heteroaryl group), X is the first functional group bound to the surface of the semiconductor nanocrystal, Y is the second functional group present at an ortho position with respect to the first functional group (X), Z is a third functional group present at a para position with respect to the first functional group (X), provided that when m is 1, p is 0, and Ar$_1$ is pyrazole, imidazol, thiazole, triazole, pyridine, pyridazine, or pyrazine, then the second functional group comprises a substituted or unsubstituted linear or branched C2 to C10 alkenyl group, a substituted or unsubstituted linear or branched C2 to C10 alkynyl group, a substituted or unsubstituted C6 to C18 aryl group, or a substituted or unsubstituted C2 to C18 heteroaryl group, m is an integer ranging from 1 to 9, n is an integer ranging from 0 to 8, and m+n is not greater than 9.

10. The semiconductor nanocrystal-ligand composite of claim 9, wherein in Chemical Formula 1-2 Ar$_1$ and Ar$_2$ are independently a substituted or unsubstituted C6 to C20 aryl group or a substituted or unsubstituted C2 to C20 heteroaryl group.

11. The semiconductor nanocrystal-ligand composite of claim 9, wherein in Chemical Formula 1-2 Ar$_1$ and Ar$_2$ are independently benzene, naphthalene, anthracene, phenanthrene, pyrene, perylene, fluorene, pentalene, pyrazole, imidazole, thiazole, triazole, carbazole, pyridine, pyridazine, pyrimidine, pyrazine, triazine, indazole, indolizine, benzimidazole, benzothiazole, benzothiophene, benzopyrene, isoquinoline, purine, or a combination thereof connected to each other by a linker.

12. The semiconductor nanocrystal-ligand composite of claim 1, wherein the organic ligand is represented by Chemical Formula 2-2:

Chemical Formula 2-2

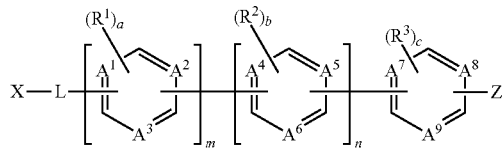

wherein in Chemical Formula 2-2

L is a single bond; a substituted or unsubstituted C1 to C30 alkylene group; or a substituted or unsubstituted C1 to C30 alkylene group comprising as a linker —O—, —NR$^a$—, —C(=O)—, —OC(=O)—, —S(=O)$_2$—, —Si(R$^b$R$^c$)$_2$—, —C(=O)NR$^d$—, or a combination thereof (wherein, R$^a$, R$^b$, R$^c$, and R$^d$ are independently hydrogen, a C1 to C10 alkyl group, a C2 to C10 alkenyl group, a C2 to C10 alkynyl group, a C6 to C18 aryl group, or a C2 to C18 heteroaryl group), A$^1$ to A$^9$ are independently CR$^e$ or N (wherein, R$^e$ is hydrogen, a substituted or unsubstituted linear or branched C1 to C10 alkyl group, a substituted or unsubstituted linear or branched C2 to C10 alkenyl group, a substituted or unsubstituted linear or branched C2 to C10 alkynyl group, a substituted or unsubstituted C6 to C18 aryl group, or a substituted or unsubstituted C2 to C18 heteroaryl group), provided that one group or two groups present at an ortho position with respect to the functional group (-L-X) of A$^1$ to A$^3$ is CR$^e$ (wherein, R$^e$ is a substituted or unsubstituted linear or branched C1 to C10 alkyl group, a substituted or unsubstituted linear or branched C2 to C10 alkenyl group, a substituted or unsubstituted linear or branched C2 to C10 alkynyl group, a substituted or unsubstituted C6 to C18 aryl group, or a substituted or unsubstituted C2 to C18 heteroaryl group), X is the first functional group bound to the surface of the semiconductor nanocrystal, Z is a third functional group present at a para position with respect to the first functional group (X), R$^1$, R$^2$, and R$^3$ are each independently hydrogen, a C1 to C10 alkyl group, a C2 to C10 alkenyl group, a C2 to C10 alkynyl group, a C6 to C18 aryl group, a C2 to C18 heteroaryl group, or R$^e$ of CR$^e$ and one of R$^1$, R$^2$, or R$^3$ are linked with each other to form an aromatic ring group, a and b are an integer ranging from 0 to 1, c is an integer ranging from 0 to 2, m is an integer ranging from 1 to 9, n is an integer ranging from 0 to 8, and m+n is not greater than 9.

13. The semiconductor nanocrystal-ligand composite of claim 1, wherein the semiconductor nanocrystal comprises a Group II-VI compound, a Group III-V compound, a Group IV-VI compound, a Group IV element or compound, a Group compound, a Group I-II-IV-VI compound, or a combination thereof.

14. A semiconductor nanocrystal-ligand composite, comprising
a semiconductor nanocrystal and a ligand layer comprising an organic ligand coordinated on a surface of the semiconductor nanocrystal,
wherein the organic ligand comprises a moiety having a conjunction structure and a first functional group (X), a second functional group (Y), and optionally, a third functional group (Z) at a para position with respect to the first functional group linked to the moiety having a conjunction structure, wherein the organic ligand is a monomer or a oligomer,
wherein the first functional group (X) is bound to the surface of the semiconductor nanocrystal and the second functional group (X), and when the moiety having a conjunction structure comprises an aromatic ring group, wherein the aromatic ring group is a substituted or unsubstituted monocyclic aromatic ring group, then i) the third functional group (Z) is present at the para position with respect to the first functional group, and ii) the second functional group comprises a substituted or unsubstituted linear or branched C1 to C10 alkyl group, a substituted or unsubstituted linear or branched C2 to C10 alkenyl group, a substituted or unsubstituted C6 to C18 aryl group, or a substituted or unsubstituted C2 to C18 heteroaryl group, wherein the ligand layer further comprises a second organic ligand, wherein the second ligand is RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR', RPO(OH)$_2$ or R$_2$POOH (wherein, R and R' are each independently a substituted or unsubstituted C1 to C24 alkyl group, a substituted or unsubstituted C2 to C24 alkenyl group, or a substituted or unsubstituted C2 to C24 alkynyl group).

15. A semiconductor nanocrystal-ligand composite, comprising
a semiconductor nanocrystal and a ligand layer comprising an organic ligand coordinated on a surface of the semiconductor nanocrystal,
wherein the organic ligand comprises a moiety having a conjunction structure and a first functional group (X), a second functional group (Y), and optionally, a third functional group (Z) at a para position with respect to the first functional group linked to the moiety having a conjugation structure, wherein the organic ligand is a monomer or an oligomer,
wherein the first functional group (X) is bound to the surface of the semiconductor nanocrystal and the second functional group (Y) is present at an ortho position with respect to the first functional group (X), and when the moiety having a conjugation structure comprises an aromatic ring group, wherein the aromatic ring group is a substituted or unsubstituted monocyclic aromatic ring group, then i) the third function group (Z) is present at the para position with respect to the first functional group ii) the second functional group comprises a substituted or unsubstituted linear or branched C1 to C10 alkyl group, a substituted or unsubstituted linear or branched C2 to C10 alkenyl group, a substituted or unsubstituted C6 to C18 aryl group, or a substituted or unsubstituted C2 to C18 heteroaryl group, wherein the semiconductor nanocrystal-ligand composite further comprises a polyvalent metal compound.

16. The semiconductor nanocrystal-ligand composite of claim 15, wherein the polyvalent metal compound comprises Zn, In, Ga, Mg, Ca, Sc, Sn, Ti, V, Cr, Mn, Fe, Co, Ni, Cu, Sr, Y, Zr, Nb, Mo, Cd, Ba, Au, Hg, Tl, or a combination thereof.

17. The semiconductor nanocrystal-ligand composite of claim 15, wherein the polyvalent metal compound comprises an organometallic compound, an organic salt, an inorganic salt, or a combination thereof.

18. The semiconductor nanocrystal-ligand composite of claim 15, wherein the polyvalent metal compound is a metal halide, a metal alkyl, a metal carboxylate, a metal (meth)

acrylate, a metal dialkyldithiocarbamate, a metal chalcogenide, or a combination thereof.

19. An electronic device, comprising
a first electrode and a second electrode facing each other; and
an emission layer disposed between the first electrode and the second electrode and comprising a plurality of semiconductor nanocrystal-ligand composites, wherein the plurality of semiconductor nanocrystal-ligand composites comprise the semiconductor nanocrystal-ligand composite of claim 1.

20. The electronic device of claim 19, wherein the electronic device is a light emitting diode (LED), an organic light emitting diode (OLED), a sensor, an imaging sensor, a photodetector, a solar cell, or a liquid crystal display (LCD) device.

* * * * *